United States Patent [19]
Nakajima et al.

[11] Patent Number: 5,999,345
[45] Date of Patent: Dec. 7, 1999

[54] MULTI-BEAM LIGHT SOURCE UNIT

[75] Inventors: Tomohiro Nakajima, Mashida; Kohji Sakai, Tokyo, both of Japan

[73] Assignee: Ricoh Company, Ltd., Japan

[21] Appl. No.: 09/107,211

[22] Filed: Jun. 30, 1998

[30] Foreign Application Priority Data

| Jul. 3, 1997 | [JP] | Japan | 9-178479 |
| Nov. 19, 1997 | [JP] | Japan | 9-318433 |
| Apr. 16, 1998 | [JP] | Japan | 10-106599 |

[51] Int. Cl.$^6$ .................................................... G02B 7/02
[52] U.S. Cl. ..................... 359/821; 359/204; 359/618; 359/381; 240/234
[58] Field of Search ..................... 359/821, 618, 359/625, 629, 201, 203, 204, 381, 813; 250/234, 235, 236

[56] References Cited

U.S. PATENT DOCUMENTS

| 3,631,775 | 1/1972 | Tidd | 359/821 |
| 5,475,415 | 12/1995 | Noethen | 359/629 |
| 5,694,180 | 12/1997 | Deter et al. | 359/618 |
| 5,834,766 | 11/1998 | Suhara | 250/234 |
| 5,838,479 | 11/1998 | Shiraishi | 359/204 |

FOREIGN PATENT DOCUMENTS 56-42248  4/1981  Japan .

*Primary Examiner*—Loha Ben
*Attorney, Agent, or Firm*—Graham & James LLP

[57] ABSTRACT

A multi-beam light source unit includes a light source section having a plurality of semiconductor lasers, a plurality of collimating lenses for collimating light beams emitted from the semiconductor lasers, and a supporting member for supporting the plurality of semiconductor lasers and the plurality of collimating lenses arranged in a main scanning direction. There is a relation expressed by $D/d \neq 1$ relating to a distance $D$ between adjacent ones of the semiconductor lasers and a distance $d$ of adjacent ones of the collimating lenses, and the light source section is supported so that it can be angularly adjusted so as to change a rotational position of the light source section including the semiconductor lasers and the collimating lenses.

40 Claims, 18 Drawing Sheets

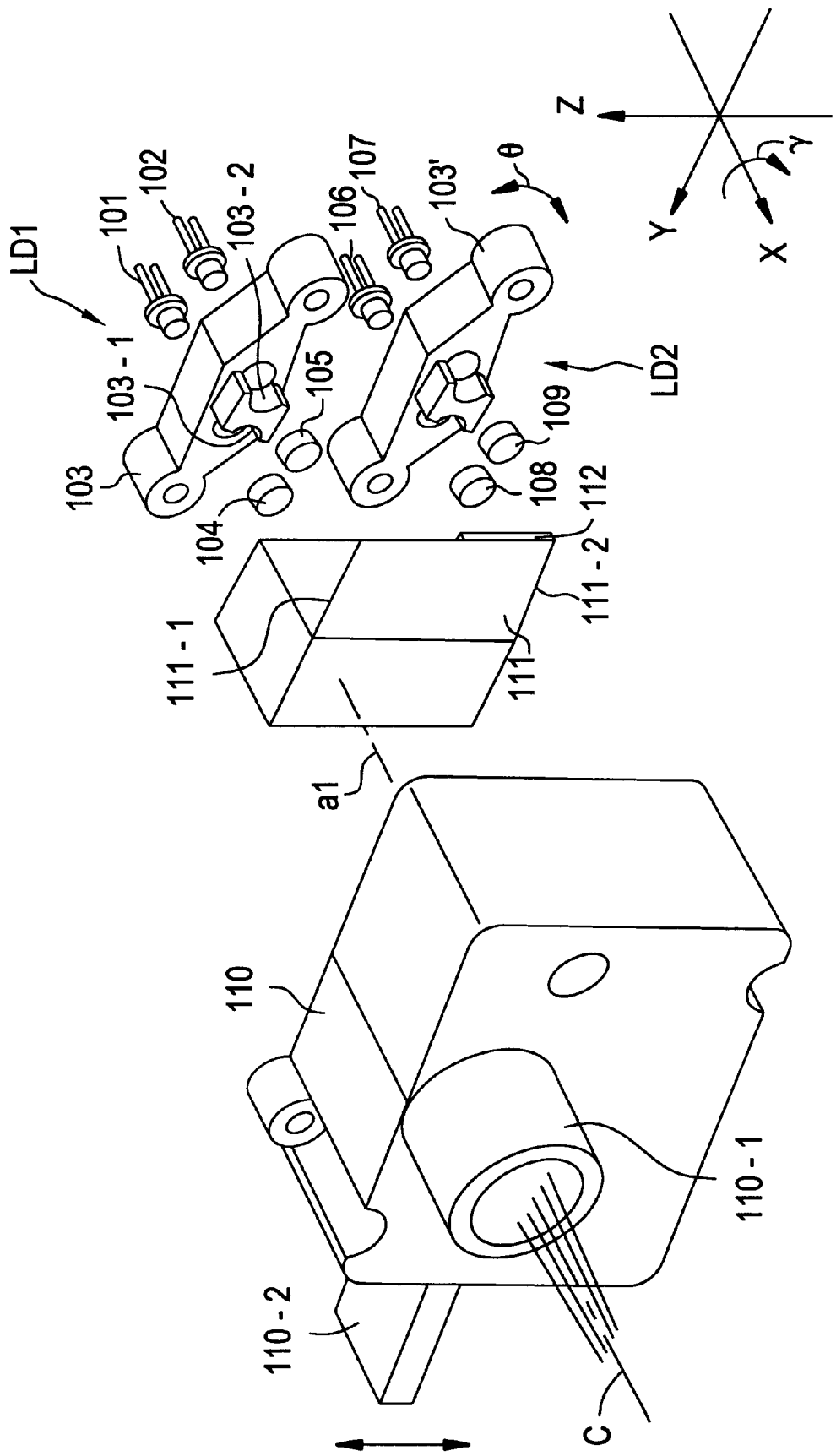

FIG.4A
polygon mirror reflective surface 2
$\alpha 1 = \alpha 2$
$(\alpha 1 + \alpha 2 = \alpha)$
FIG.4B
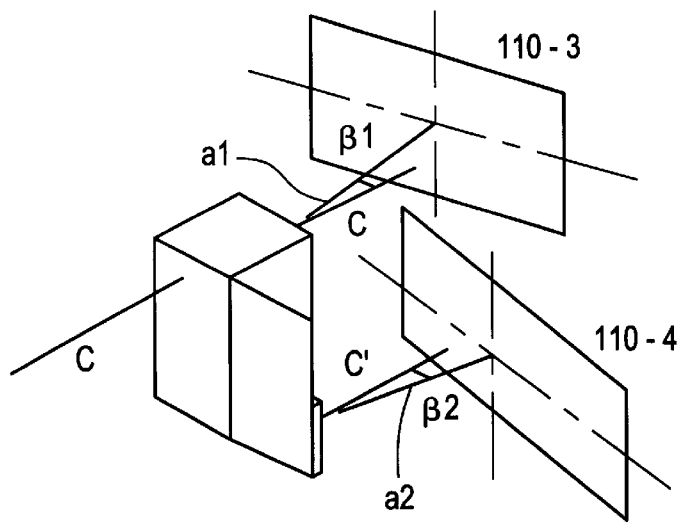
FIG.4C
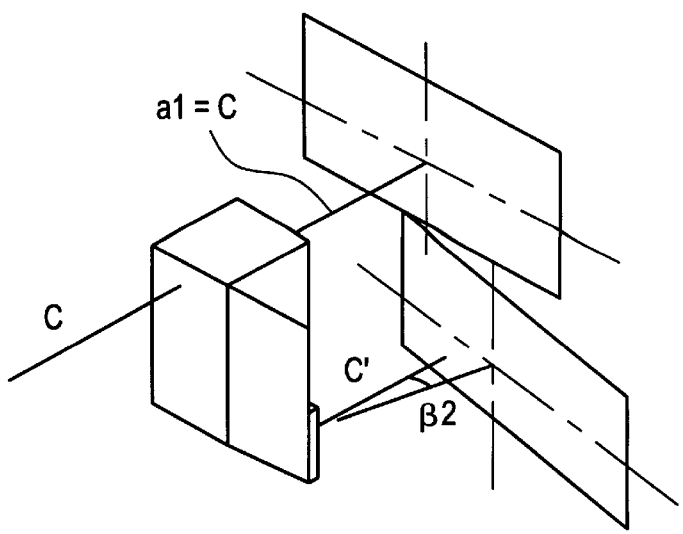

1 polygon mirror reflective surface $\alpha 1 \neq \alpha 2$
$(\alpha 1 + \alpha 2 = \alpha)$

MULTI-BEAM LIGHT SOURCE UNIT

BACKGROUND OF THE INVENTION

1. Field of the Invention

The present invention relates to a light source unit of an optical scanning apparatus used in a writing system of a recording apparatus such as a digital copying machine, a laser printer, a laser facsimile or similar device, and more particularly, to a multi-beam light source unit for use in a multi-beam optical scanning apparatus having a significantly increased recording speed achieved by simultaneously scanning a photosensitive body with a plurality of light beams.

2. Description of Related Art

In an optical scanning apparatus for use in a writing system of a recording apparatus such as a digital copying machine, a laser printer, a laser facsimile or other similar devices, one way of increasing a recording speed is to increase a rotating speed of a rotary polygon mirror used as a light deflector. This solution causes problems with durability of a motor, noise, vibration, and a modulation speed of a semiconductor laser, all of which limit the recording speed.

To solve these problems, there is provided a multi-beam optical scanning apparatus in which a recording speed is increased by scanning a photosensitive body with a plurality of laser beams simultaneously so as to record a plurality of lines simultaneously.

An example of such a multi-beam optical scanning apparatus which is constructed such that light flux from a plurality of semiconductor laser light sources are synthesized by using a beam splitter, and an apparatus with a semiconductor laser array in which a plurality of light emitting sources are arranged in an array, is disclosed in Japanese Unexamined Patent Publication No. 56-42248.

The semiconductor laser array disclosed in JP 56-42248 has a plurality of light emitting sources. However, a common sensor is used for detecting outputs of the plurality of light emitting sources and therefore, it is impossible to perform a feedback of the optical output of each light emitting source in real time unlike a general semiconductor laser. Nonetheless, since the light emitting sources are located close to each other, an optical output of each light emitting source is not constant due to interference between the adjacent light sources, and therefore, accurate and precise control of the total light volume is difficult. In addition, this device is much more expensive than other devices. Thus, the characteristics of the device described above increase the disadvantages as the number of the light emitting sources becomes greater.

On the other hand, the problems as mentioned above do not occur in an apparatus in which a plurality of general-purpose semiconductor lasers are used and light beams from the plurality of semiconductor laser light sources are synthesized. However, the use of semiconductor laser light sources requires improvement of environmental stability and a handling characteristic thereof.

A known multi-beam optical scanning apparatus includes an arrangement in which two light beams from two semiconductor lasers are synthesized and are moved simultaneously by a deflector such as a rotary polygon mirror in order to record adjacent lines.

Recently, it has been necessary to further increase the recording speed and density, and there is provided an apparatus in which a semiconductor laser array is used for the light sources in order to meet this requirement. The semiconductor laser array, however, has control limitations as described above and therefore, it cannot be used in the same manner as a general-purpose semiconductor laser and is inappropriate for high-precision output controls. In addition, since a single collimating lens is used with the plurality of light sources in such an apparatus, a wavelength difference or a difference in a light emitting point position between light sources occurs which causes an error in an image forming position or a diffusion of beams emitted from the collimating lens in directions in which the beams are separated from each other.

On the other hand, in a multi-beam light source unit in which two or more general-purpose semiconductor lasers are used and in which the beams are synthesized with beam splitters or prisms, it is necessary to synthesize the beams in units of a single beam by providing beam splitters or prisms in a plurality of stages. Therefore, the assembly and arrangement of the device becomes extremely complicated. This complicated construction makes it very difficult to perform accurate positioning of the beams or to maintain precise beam spot intervals. In addition, since the complicated construction increases an accumulation of a positioning error, high precision is required for respective parts, and consequently, a correcting unit for detecting a beam position and then correcting the beam position which is deflected with the passage of time is required, which leads to increased cost and assembling difficulty.

In addition, recently, recording apparatuses have been upgraded to include a multi-functioning capability. Also, there is a tendency that the recording apparatuses should provide a function allowing for selection of recording densities according to various types of uses of the recording apparatus. To make the recording densities variable in the recording apparatuses using the multi-beam light source as described, however, it is necessary to make the scanning line intervals in the sub-scanning direction variable in addition to making the modulation speed of a polygon motor or semiconductor lasers variable.

SUMMARY OF THE INVENTION

The preferred embodiments of the present invention overcome the problems described above by providing a multi-beam light source unit having excellent stability in beam spot position and beam spot interval despite the passage of time and a simple construction without requiring that beam splitters be provided in a plurality of stages even when two or more general-purpose semiconductor lasers are used and beams are synthesized by beam splitters, and achieving an easy and accurate adjustment of beam spot intervals (setting of scanning line intervals in a sub-scanning direction).

Further, the preferred embodiments of the present invention provide a multi-beam light source unit which can change a scanning line interval in the sub-scanning direction to another interval easily and reliably to provide for accurate and reliable beam spot positions and intervals and to allow for easy and accurate selection of recording density.

Furthermore, the preferred embodiments of the present invention provide a multi-beam light source unit in which the number of beams is significantly increased as compared to prior art devices while minimizing light emitting output and eliminating a loss of light volume, and while maintaining a constant pitch of beam spots.

According to a specific preferred embodiment of the present invention, there is provided a multi-beam light source unit including a light source section having a plurality of semiconductor lasers, a plurality of collimating lenses for collimating light beams output from the semiconductor lasers, and a supporting member for integrally supporting the plurality of semiconductor lasers and the plurality of collimating lenses arranged in a main scanning direction. The light source section preferably is arranged to have a relationship expressed by D/d≠1 in which D is a distance between adjacent ones of the semiconductor lasers and d is a distance between adjacent ones of the collimating lenses. The light source section is supported so that a rotational or angular orientation of the light source section can be changed easily and accurately.

The relationship D/d≠1 is important because it provides for far more accurate adjustment of the beam spot pitch so as to provide maximum beam spot position and interval accuracy and to ensure that any changes thereto are done precisely and reliably. More specifically, by arranging the plurality of semiconductor lasers and the collimator lenses to have the relationship D/d≠1 as described above, this allows a large amount of rotation of the light source section to produce a small and accurate change in the pitch of the beam spot produced on a surface to be scanned.

More specifically, the support member supporting the light source unit is preferably mounted such that the support member can be rotatably adjusted so as to change a rotational orientation of the support member, the semiconductor lasers and the collimating lenses. In this preferred embodiment, the support member is mounted on a mounting member so as to be rotatable relative to change an angular orientation of the light source unit. In this preferred embodiment, an angular adjusting device for adjusting an angular position of the support member and light source unit is removably provided and engaged with the support member so as to rotate or adjust the angular position of the support member such that the rotational orientation of the support member, the semiconductor lasers and the collimating lenses are adjusted accurately and as desired.

In another preferred embodiment, the light source unit may be rotatably mounted on and relative to the support member. The feature of this preferred embodiment can be provided alone such that only the light source unit is rotatable relative to the support member. Alternatively, this feature can be combined with the above-described feature in which the support member is rotatable so as to change the angular orientation of the light source unit including the semiconductor lasers and the collimating lenses.

The multi-beam light source unit according to another specific preferred embodiment of the present invention includes a first light source section having a plurality of first semiconductor lasers and first collimating lenses for collimating light beams emitted from the plurality of first semiconductor lasers, and a first supporting member for integrally supporting the first semiconductor lasers and the first collimating lenses arranged along a first light emitting axis, and a second light source section having a plurality of second semiconductor lasers, a plurality of second collimating lenses for collimating light beams emitted by the second semiconductor lasers, and a second supporting member for integrally supporting the plurality of second semiconductor lasers and the plurality of second collimating lenses symmetrically arranged along a second light emitting axis, and a beam synthesizing device for emitting the light beams of the first and second light source sections so as to bring the light beams closer together, wherein a distance between adjacent ones of the first semiconductor lasers is not equal to a distance between adjacent ones of the first collimating lenses and a distance between adjacent ones of the second semiconductor lasers is not equal to a distance between adjacent ones of the second collimating lenses, and the first and second supporting members are mounted so as to be capable of being angularly adjusted to change a rotational position of the first and second light source sections.

In this preferred embodiment described in the preceding paragraph, the first and second supporting members supporting the first and second light source units, respectively, may be mounted such that the first and second supporting members can be rotatably adjusted either separately or together, so as to change a rotational orientation of the first and second support members along with the first and second semiconductor lasers and the first and second collimating lenses, or so as to change a rotational orientation of the first and second semiconductor lasers and the first and second collimating lenses relative to the first and second support members, respectively. It should be noted that, in such preferred embodiments, the first support member is preferably mounted to be rotatingly adjusted separately from the rotational adjustment of the second support member. Similarly, in the other preferred embodiment described above, the first semiconductor lenses and first collimating lenses can be rotated relative to the first support member independently of the second semiconductor lenses and second collimating lenses being rotated relative to the support member.

In addition, each of the first and second light source units may be rotatable relative to the respective first and second support members, either separately or in conjunction with the rotatable mounting of the first and second support members.

According to preferred embodiments of the present invention, the multi-beam light source unit described in the previous paragraphs may be configured such that the first light source section has odd-numbered semiconductor lasers, odd-numbered collimating lenses for collimating light beams emitted by the odd-numbered semiconductor lasers, and a first supporting member for integrally supporting the odd-numbered semiconductor lasers and odd-numbered collimating lenses arranged in the main scanning direction and with a central one of the odd-numbered semiconductor lasers arranged along a light emitting axis, and the second light source section has even-numbered semiconductor lasers, even-numbered collimating lenses for collimating light beams emitted from the even-numbered semiconductor lasers, and a second supporting member for integrally supporting the even-numbered semiconductor lasers and even-numbered collimating lenses symmetrically arranged along the light emitting axis in the main scanning direction, and further, such that the light emitting axis of the first light source section and the light emitting axis of the second light source section are spaced at a given angle or at a given interval in the main scanning direction.

The multi-beam light source unit according to another specific preferred embodiment of the present invention includes a first light source section having a plurality of semiconductor lasers, a plurality of collimating lenses for collimating respective light beams emitted from the semiconductor lasers, and a supporting member for integrally supporting the plurality of semiconductor lasers and the plurality of collimating lenses symmetrically arranged along a first light emitting axis in a main scanning direction, a second light source section having substantially the same constitution as the first light source section, and a beam synthesizer for emitting light beams of the first and second light source sections so as to make the light beams closer to each other.

The multi-beam light source unit described immediately above may be configured such that the first light source section has even-numbered semiconductor lasers, even-numbered collimating lenses for collimating respective light beams emitted from the even-numbered semiconductor lasers, and a first supporting member for integrally supporting the even-numbered semiconductor lasers and even-numbered collimating lenses symmetrically arranged relative to the light emitting axis in the main scanning direction, and the light emitting axis of the first light source section and the light emitting axis of the second light source section are spaced at a given angle or at a given interval in the main scanning direction.

Further, according to preferred embodiments of the present invention, the first and second light source sections and the beam synthesizer may be assembled into an integral module so as to be attachable or detachable to or from an optical housing and the integral module may be rotatably supported relative to an optical axis of a main scanning optical device functioning as a rotational axis with the light emitting axis of one of the light source sections being coincident with the optical axis.

The multi-beam light source unit according to preferred embodiments of the present invention may further include a mounting member for supporting the first and second light source sections and the beam synthesizer which are preferably integrally assembled into a unitary module. The mounting member is preferably rotatably supported relative to an optical scanner provided for scanning a surface to be scanned in the main scanning direction with beam spots formed by converging a plurality of light beams emitted from the multi-beam light source unit, and around an optical axis of the scanner which functions as a rotational center. Further, the first and second light source sections are arranged so that the light emitting axis of the first light source section and the light emitting axis of the second light source section are symmetrical relative to the optical axis in the main scanning direction.

In the multi-beam light source unit described in the preceding paragraphs according to various preferred embodiments of the present invention, a mounting reference surface of the mounting member is preferably substantially perpendicular to each light emitting axis of the first and second light source sections.

Furthermore, in the multi-beam light source unit according to preferred embodiments of the present invention, the semiconductor lasers of the groups of semiconductor lasers and the collimating lenses symmetrically arranged relative to each light emitting axis of the first and second light source sections may have equal shift amounts from the collimating lens optical axis.

The shifts of the semiconductor lasers from the collimating lens optical axes may be set so that the main light beams emitted from the plurality of semiconductor lasers supported by the first light source section intersect each other in the main scanning direction in the vicinity of a rotary polygon mirror of an optical scanning apparatus, and the main light beams emitted from the plurality of semiconductor lasers supported by the second light source section intersect each other in the main scanning direction in the vicinity of the rotary polygon mirror of the optical scanning apparatus.

Furthermore, the light emitting axis of the first light source section and the light emitting axis of the second light source section may be spaced at a given angle or at a given interval in the main scanning direction so that the light emitting axes intersect each other in the main scanning direction in the vicinity of the rotary polygon mirror of the optical scanning apparatus.

Other novel characteristics, features and advantages of the preferred embodiments of the present invention will become apparent from the detailed description of preferred embodiments of the present invention and the illustrations of the preferred embodiments in the drawings described below.

BRIEF DESCRIPTION OF THE DRAWINGS

FIG. 3 is a constitutional explanatory diagram illustrating a multi-beam light source unit according to another preferred embodiment of the present invention including a 4-beam light source unit having a total of four general-purpose semiconductor lasers;

FIGS. 4(a), 4(b) and 4(c) are diagrams illustrating an example of light emitting axes of light source sections spaced at a given angle in preferred embodiments of the present invention;

DETAILED DESCRIPTION OF PREFERRED EMBODIMENTS

Preferred embodiments of the present invention will be described in detail below by referring to the accompanying drawings.

Figure 1:
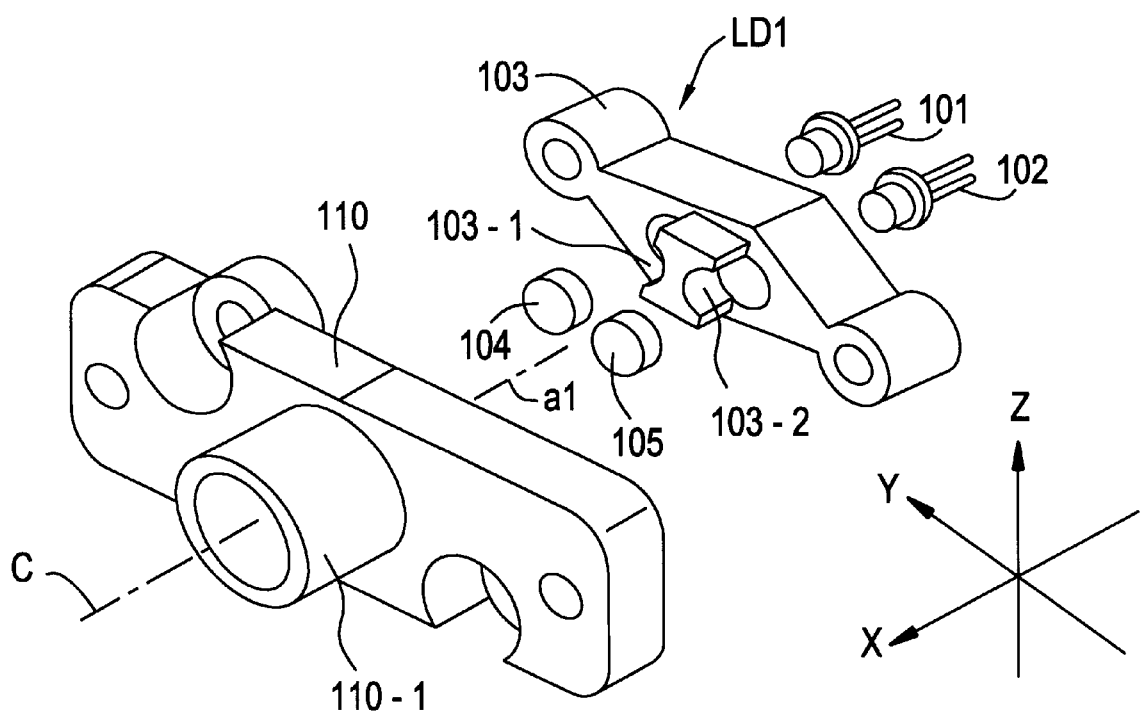
FIG. 1 is a constitutional explanatory diagram illustrating a multi-beam light source unit according to a preferred embodiment of the present invention including a 2-beam light source unit having a total of two general-purpose semiconductor lasers.

Referring to FIG. 1, there is shown a constitutional explanatory diagram of a multi-beam light source unit according to one preferred embodiment of the present invention, illustrating a 2-beam light source unit preferably having a total two general-purpose semiconductor lasers. In FIG. 1, semiconductor lasers 101 and 102 are mounted and supported by being pressed into mating holes (not shown) formed preferably to be substantially parallel to each other and at a desired interval, for example, about 8 mm, in a main scanning direction (in a Y direction in the drawing) at the back of a supporting member 103. The supporting member 103 may preferably be made of aluminum die casting or other suitable material. Collimating lenses 104 and 105 are provided and are paired with the semiconductor lasers 101 and 102, respectively, so as to be positioned in an X direction so that each diverging luminous flux of the semiconductor lasers 101 and 102 becomes a parallel luminous flux, and further, in Y and Z directions so that a predetermined beam emitting direction is achieved. The lenses 104, 105 are preferably fixed in place on the supporting member 103 via adhesive filled in a gap between the lenses 104, 105 and substantially U-shaped supporting sections 103-1 and 103-2 of the supporting member 103 arranged to be aligned with the mating holes of the semiconductor lasers 101 and 102. A first light source section LD1 is constituted by the semiconductor lasers 101, 102; the collimator lenses 104, 105 and the supporting member 103 as described above.

While the above-described preferred embodiment shows that the supporting member 103 is used to support the semiconductor lasers 101 and 102 and the collimating lenses 104 and 105 directly, the lasers and lenses may be supported by the supporting member 103 via a mounting member, described later, for holding the semiconductor lasers or for holding the collimating lenses. Preferably, the mounting member and the supporting member 103 are made of the same material or have equivalent thermal characteristics.

Figure 2B:
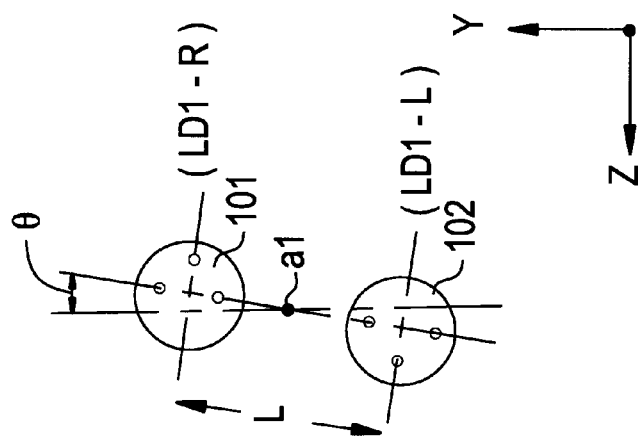
FIG. 2(b) is a diagram of a 2-beam light source viewed from the back side in the X direction, illustrating an arrangement of semiconductor lasers in a preferred embodiment of the present invention.
Figure 2A:
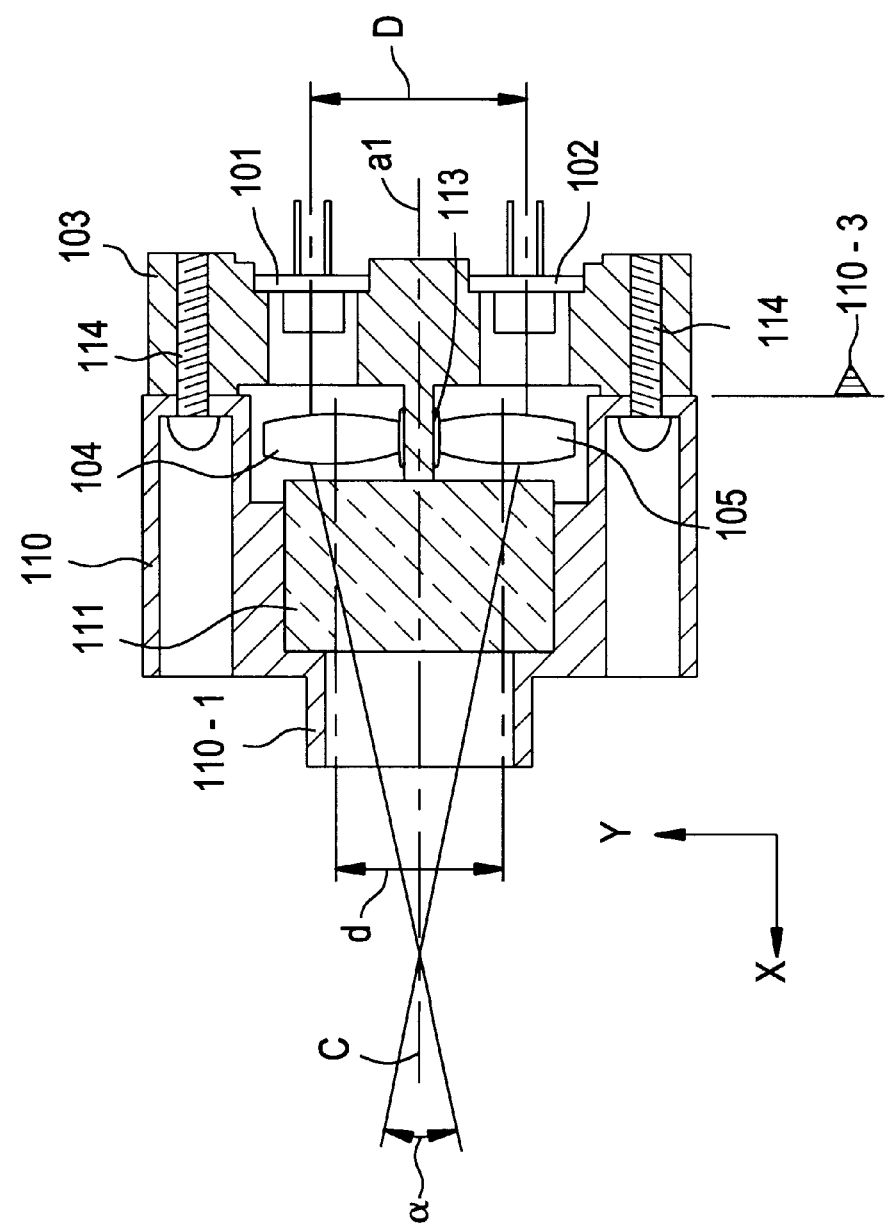
FIG. 2(a) is a cross section of a multi-beam light source unit of a preferred embodiment of the present invention, in parallel with the X and Y directions.

Referring to FIG. 2(a), there is shown a cross section of the multi-beam light source unit, in parallel with the X and Y directions, in which the first light source section LD1 and a beam synthesizing prism 111 are incorporated into a mounting member 110. The semiconductor lasers 101 and 102 and the collimating lenses 104 and 105 are preferably disposed symmetrically relative to a light emitting axis a1 of the first light source section LD1 and a space d between adjacent collimating lenses 104 and 105 is preferably smaller than a space D between adjacent semiconductor lasers 101 and 102 such that D/d>1 is satisfied.

Alternatively, the distance d between adjacent collimating lenses 104 and 105 may be larger than the distance D between adjacent semiconductor lasers 101 and 102 such that D/d<1 is satisfied.

In other words, in the preferred embodiment shown in FIG. 2(a), the collimating lenses 104 and 105 are disposed with their optical axes deflected toward the light emitting axis a1 in the Y direction and fixed to the substantially U-shaped supporting portions 103-1 and 103-2 (FIG. 1) of the supporting member 103 via adhesive 113. With this construction, laser beams from the semiconductor lasers 101 and 102 are emitted via the collimating lenses 104, 105 at an angle α in directions which make the laser beams cross each other.

Figure 2C:
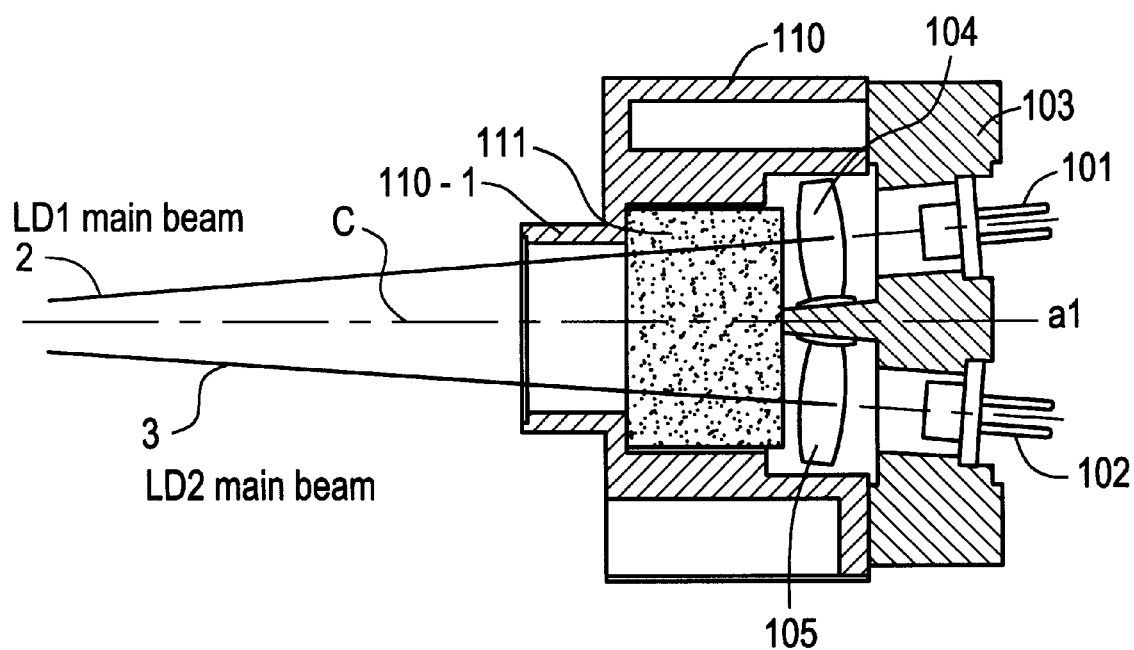
FIG. 2(c) is a cross section of another example of the multi-beam light source unit of preferred embodiments of the present invention, in parallel with the X and Y directions, in which pairs of collimating lenses and semiconductor lasers are arranged along the same optical axes.

Naturally, as shown in FIG. 2(c), pairs of the collimating lenses 104 and 105 and the semiconductor lasers 101 and 102 may be disposed along the same optical axes and the supporting member 103 may be arranged such that the entire optical axes define an inclination of a. In both of the light source sections, the light emitting directions of the main light beams are preferably set so that the position where the beams cross each other is located in the vicinity of a polygon mirror reflective surface of an optical scanning apparatus.

The light source section LD1 in the present preferred embodiment is preferably bonded to a reference surface 110-3 provided at the back of the mounting member 110 with the light emitting axis a1 adjusted so as to be coincident with a center C of a cylindrical portion 110-1 which is a rotational reference of the mounting member 110 and preferably fixed with screws 114 inserted from the front of the mounting member 110.

As shown in FIG. 2(b), the first light source section LD1 is disposed with an inclination of θ from the main scanning direction (the Y direction) to the sub-scanning direction (the Z direction) with the light emitting axis a1 being a rotational center. It is possible to adjust the beam spot interval in the sub-scanning direction on a scanned surface of a photosensitive body or the like by adjusting the inclination θ.

Referring to FIG. 3, there is shown a constitutional explanatory diagram of a multi-beam light source unit according to another preferred embodiment of the present invention, illustrating a 4-beam light source unit having a total of four general-purpose semiconductor lasers. In FIG. 3, semiconductor lasers 101 and 102 are respectively mounted in mating holes (not shown) preferably arranged to be substantially parallel and spaced from each other at a suitable distance, for example, about 8 mm, in a main scanning direction (in a Y direction of FIG. 3) so as to be supported at the back of a supporting member 103. Collimating lenses 104 and 105 are provided and paired with the semiconductor lasers 101 and 102 so as to be positioned in an X direction so that each diverging luminous flux of the semiconductor lasers 101 and 102 becomes a parallel luminous flux, and further, in Y and Z directions so that a predetermined beam emitting direction is achieved. The lenses 104, 105 are preferably fixed via adhesive filled in a gap between the lenses 104, 105 and the substantially U-shaped supporting sections 103-1 and 103-2 of the supporting member 103 so as to be aligned with the mating holes of the semiconductor lasers 101 and 102, so as to compose a first light source section LD1. A second light source section LD2 includes semiconductor lasers 106 and 107, collimating lenses 108 and 109, and a supporting member 103'. The second light source section LD2 is preferably constructed in the same manner as the first light source section LD1.

While the above preferred embodiment shows that the supporting member 103 is used to support the semiconductor lasers 101 and 102 and the collimating lenses 104 and 105 directly and the supporting member 103' is used to support the semiconductor lasers 106 and 107 and the collimating lenses 108 and 109 directly, the lasers and lenses may be supported by the supporting members 103 and 103' via mounting members for holding the semiconductor lasers or for holding the collimating lenses. Preferably, the mounting members and the supporting members are made of the same material or have equivalent thermal characteristics.

Referring to FIG. 2(a), there is shown a cross section of the first light source section in the multi-beam light source unit, in parallel with the X and Y directions, in which the first light source section LD1, the second light source section LD2, and a beam synthesizing prism 111 are incorporated into the mounting member 110. The semiconductor lasers 101 and 102 and the collimating lenses 104 and 105 are disposed symmetrically relative to a light emitting axis a1 of the light source section and a distance d between adjacent ones of the collimating lenses 104 and 105 is preferably smaller than a distance D between the semiconductor lasers 101 and 102 so that the relationship D/d>1 is satisfied. In other words, the collimating lenses 104 and 105 are arranged such that their optical axes are deflected toward the light emitting axis a1 in the Y direction and fixed to the substantially U-shaped supporting portions 103-1 and 103-2 of the supporting member 103 via adhesive 113. As a result of this construction, laser beams from the semiconductor lasers 101 and 102 are emitted via collimating lenses 104 and 105 at an angle α in directions which make the beams cross each other.

Pairs of the collimating lenses and the semiconductor lasers may be disposed along the same optical axes and the supporting member may be arranged such that all of the optical axes make an inclination of α. In both of the light source sections LD1, LD2, the light emitting directions of the main light beams are set so that the position where the light beams cross is located in the vicinity of a polygon mirror reflective surface of an optical scanning apparatus.

The light source section LD1 in the present preferred embodiment is preferably bonded to a reference surface 110-3 provided at the back of the mounting member 110 with the light emitting axis a1 adjusted so as to be coincident with a center C of a cylindrical portion 110-1 which is a rotational reference of the mounting member 110 and is preferably fixed via screws 114 inserted from the front of the mounting member 110. The second light source preferably LD2 has the same constitution as the first light source section LD1, and its beams are emitted with a light emitting axis (not shown) of the second light source section LD2 being adjusted to be coincident with the light emitting axis a1 of the light source section LD1 via the beam synthesizing prism 111, such that all the beams are emitted adjacent to each other. The beam synthesizing prism 111 is preferably fixed by being inserted from the back of the mounting member 110 before the first and second light source sections LD1 and LD2 are mounted.

As shown in FIG. 2(b), the first light source section LD1 is disposed with an inclination of θ from the main scanning direction (the Y direction) to the sub-scanning direction (the Z direction) with the light emitting axis a1 being a rotational center. It is possible to adjust the beam spot interval in the sub-scanning direction on a scanned surface of a photosensitive body or the like by adjusting the inclination θ. Also, for the second light source section LD2, the beam spot interval in the sub-scanning direction can be adjusted in the same manner.

Figure 7:
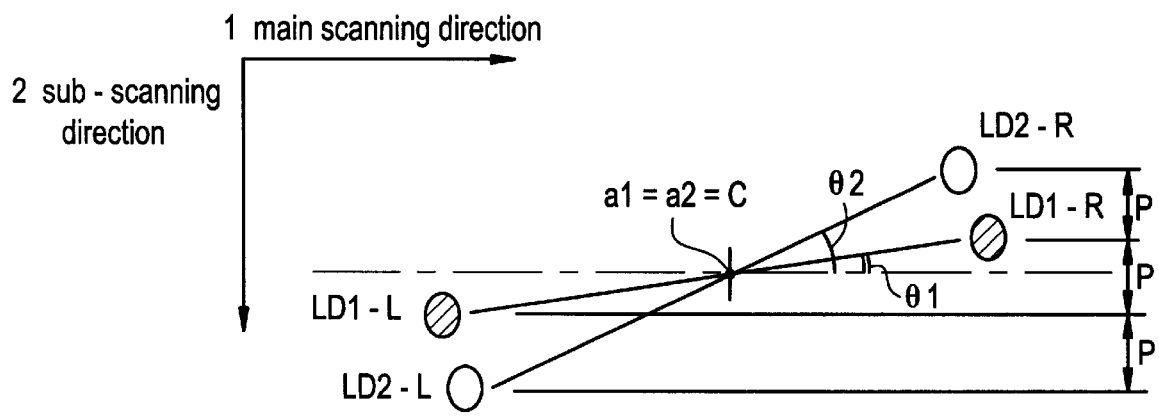
FIG. 7 a diagram illustrating an example of an arrangement of beam spots on a surface to be scanned and an example of adjusting a pitch between beam spots in a sub scanning direction in the multi-beam light source unit with a 4-beam light source unit according to a preferred embodiment of the present invention.

Since the first light source section LD1 has the same beam spot interval L as the second light source section LD2, it is possible to adjust the inclination θ from the main scanning direction (the Y direction) to the sub-scanning direction (the Z direction) so that two beam spots LD1-L and LD1-R of the first light source section LD1 and two beam spots LD2-L and LD2-R of the second light source section LD2 on a surface of the photosensitive body have a pitch P (a recording density pitch) having equal intervals in the sub-scanning direction (the Z direction), as shown in FIG. 7, by setting an inclination θ1 of the first light source section so as to be different from an inclination θ2 of the second light source section relative to the rotational center of the light emitting axis a1 (=a2=C).

Figure 8:
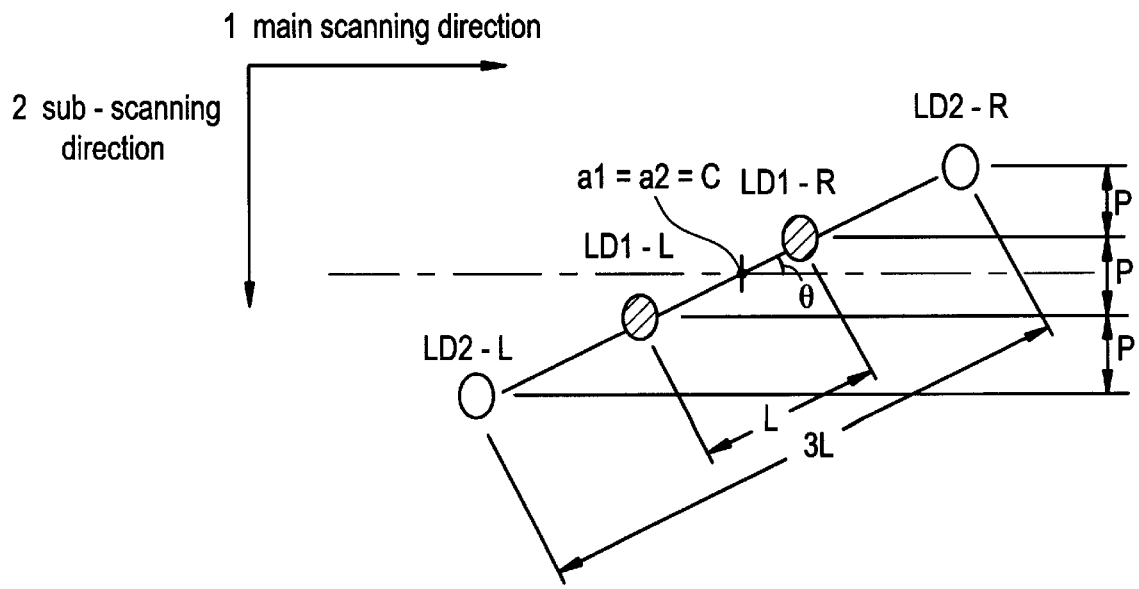
FIG. 8 is a diagram illustrating another example of an arrangement of beam spots on a surface to be scanned and adjusting a pitch between beam spots in a sub scanning direction in the multi-beam light source unit with a 4-beam light source unit according to a preferred embodiment of the present invention.

Also, by using different light beam emitting angles α and having the ratio D/d be different for the first light source section LD1 and the second light source section LD2, it is possible to obtain a pitch P having intervals which are equal in the sub-scanning direction on the surface of the photosensitive body. In this case, while a ratio of the first light source section LD1 to the second light source section LD2 cannot be defined with respect to the light emitting angle α due to a non-uniform (nonlinear.) relation L=f(α) between a beam spot interval L on the surface of the photosensitive body and the light emitting angle α according to an image forming optical system, the pitch P (the recording density pitch) having intervals which are equal in the sub-scanning direction can be provided by disposing beam spots of the first light source section LD1 and the second light source section LD2 along a straight line as shown in FIG. 8 by making the interval between two beam spots of the second light source section LD2 to be 3L relative to the interval L between two beam spots of the first light source section LD1 on the surface of the photosensitive body and making the inclination θ from the main scanning direction to the sub-scanning direction, with the light emitting axis a1=a2 (=C) of the first light source section LD1 and the second light source section LD2 being the rotational center, the same.

A beam synthesizing prism 111 shown in FIG. 3 preferably contains a polarizing beam splitter surface 111-1 inside, having a ½ wavelength plate (λ/2 plate) 112 arranged on an incident surface of the beam from the second light source section LD2 and a reflective surface 111-2 which reflects the beam from the second light source section LD2. The beam from the first light source section LD1 is emitted so as to pass directly through the polarizing beam splitter surface 111-1 and the beam from the second light source section LD2 is reflected by the ½ wavelength plate 112 with the polarizing direction rotated at 90 degrees and then is reflected upward by an inclined surface 111-2, further being reflected by the polarizing beam splitter surface 111-1 before emission therefrom. As a result of this constitution, the beams from the first and second light source sections can be easily synthesized at a lower loss of light volume.

Figure 5:
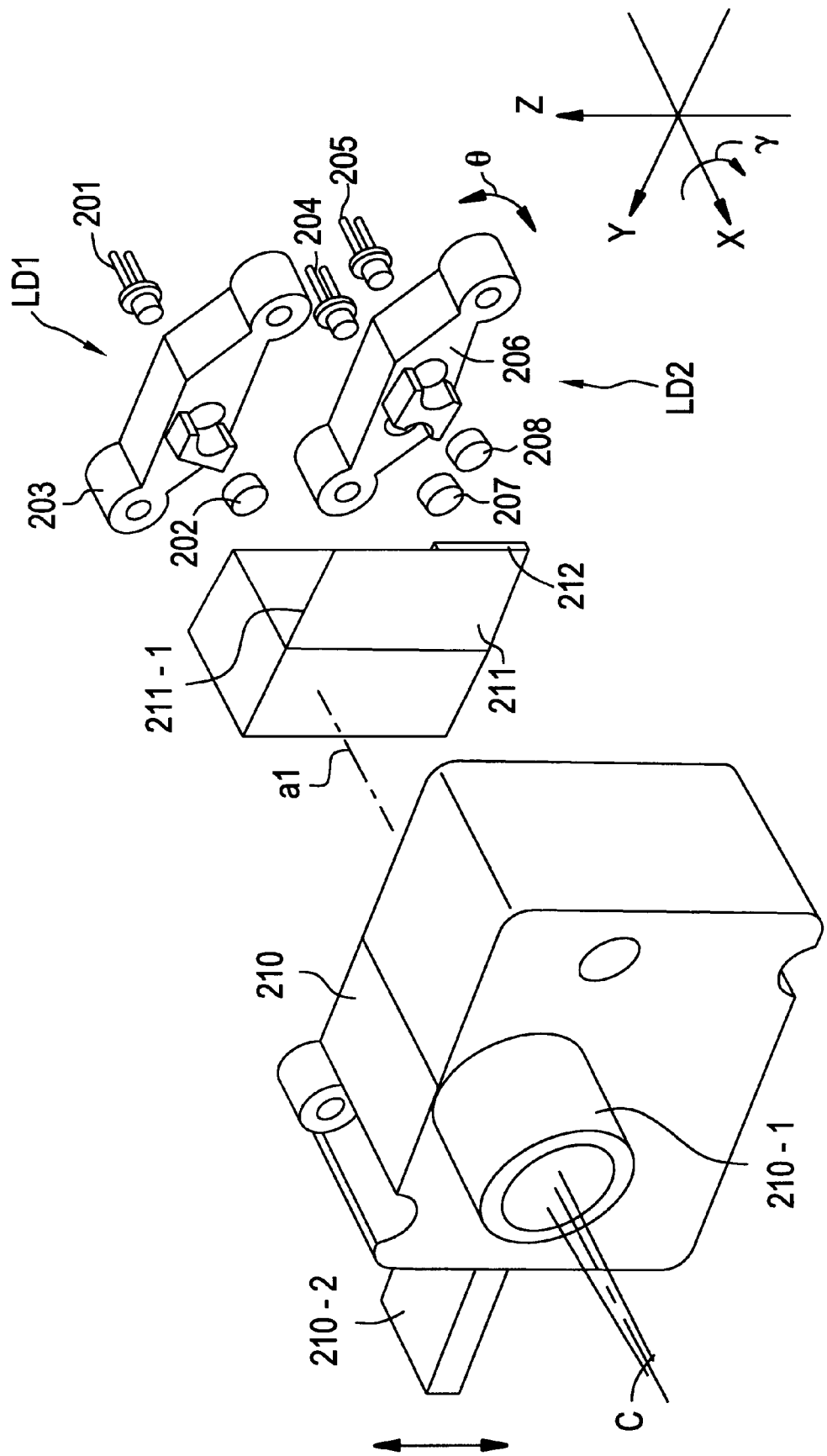
FIG. 5 is a constitutional explanatory diagram illustrating a multi-beam light source unit according to another preferred embodiment of the present invention including a 3-beam light source unit having a total of three general-purpose semiconductor lasers.

Next, referring to FIG. 5, there is shown a constitutional explanatory diagram of a multi-beam light source unit according to still another preferred embodiment of the present invention, illustrating a 3-beam light source unit having a total of three general-purpose semiconductor lasers. In the 3-beam light source unit shown in FIG. 5, a semiconductor laser 201 of a first light source section LD1 is preferably disposed at a center of a supporting member 203 and supported with its optical axis adjusted to the optical axis of a collimating lens 202. A second light source section LD2 includes two semiconductor lasers 204 and 205, two collimating lenses 207 and 208 arranged so as to be paired with the semiconductor lasers for collimating respective light beams emitted from the lasers 204, 205, and a supporting member 206 for supporting the lasers 204, 205 and lenses 207, 208, and preferably having the same construction and arrangement as the first and second light source sections described in the above preferred embodiment shown in FIG. 3 and the same cross section in parallel in the X and Y directions as the preferred embodiment shown in FIG. 2(a). The first light source section LD1, the second light source section LD2, and a synthesizing prism 211 are preferably incorporated into a mounting member 210, and two beams from the second light source section LD2 are emitted on the same light emitting axis a1 as the first light source section LD1 via the beam synthesizing prism 211. The optical axis of the semiconductor laser 201 of the first light source section LD1 and the collimating lens 202 matches the light emitting axis a1, and further the light emitting axis a1 is adjusted to be coincident with the center C of a cylindrical portion 210-1 which is used as a rotational reference of the mounting member 210.

Figure 9:
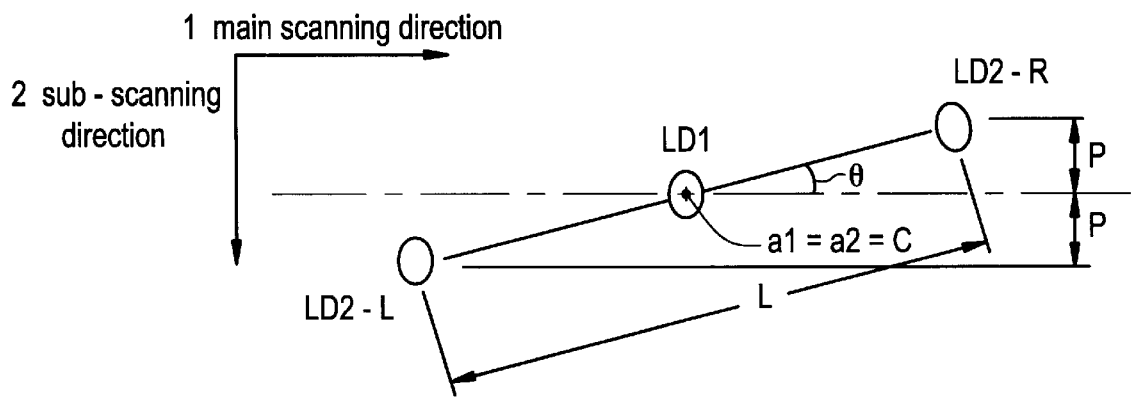
FIG. 9 is a diagram illustrating an example of an arrangement of beam spots on a surface to be scanned and an example of adjusting a pitch between beam spots in a sub scanning direction in the multi-beam light source unit with a 3-beam light source unit according to a preferred embodiment of the present invention.
Figure 10:
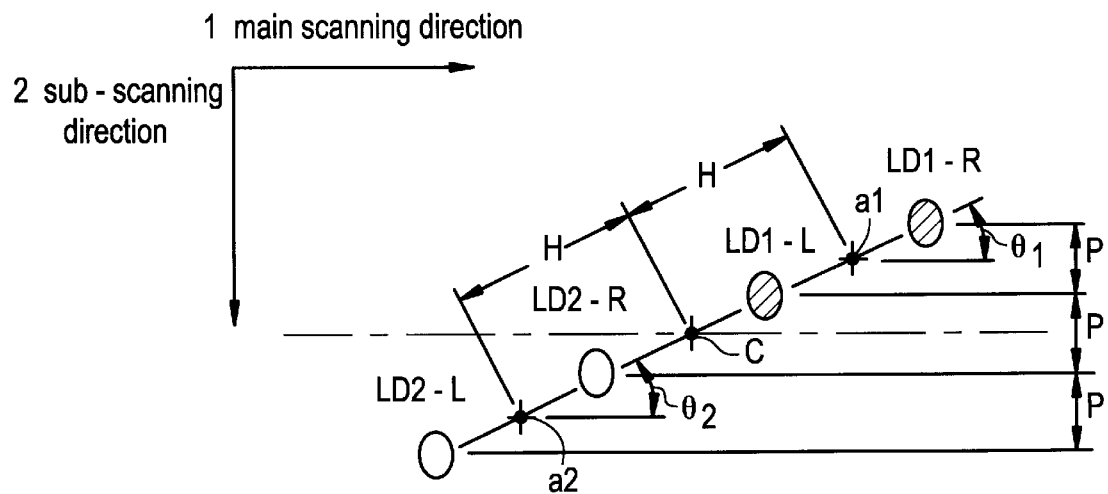
FIG. 10 a diagram illustrating an example of an arrangement of beam spots on a surface to be scanned and an example of adjusting a pitch between beam spots in a sub scanning direction in the multi-beam light source unit with a 4-beam light source unit according to a preferred embodiment of the present invention.

Accordingly, as shown in FIG. 9, it is possible to obtain a pitch P (a recording density pitch) having intervals which are equal in the sub-scanning direction by arranging two beam spots LD2-R and LD2-L along a straight line with an adjustment of an inclination θ of the second light source section LD2 in the sub-scanning direction (the Z direction) around a beam spot of the first light source section LD1 as a center. According to this arrangement, with the light emitting axis a2 adjusted to be coincident with the center C of the cylindrical portion 210-1 of the mounting member 210, the mounting member 210 can be rotated around the light emitting axis a2=C so as to adjust the inclination θ and thereby make the pitch P variable in proportion to the adjustment of the inclination θ.

Figure 6:
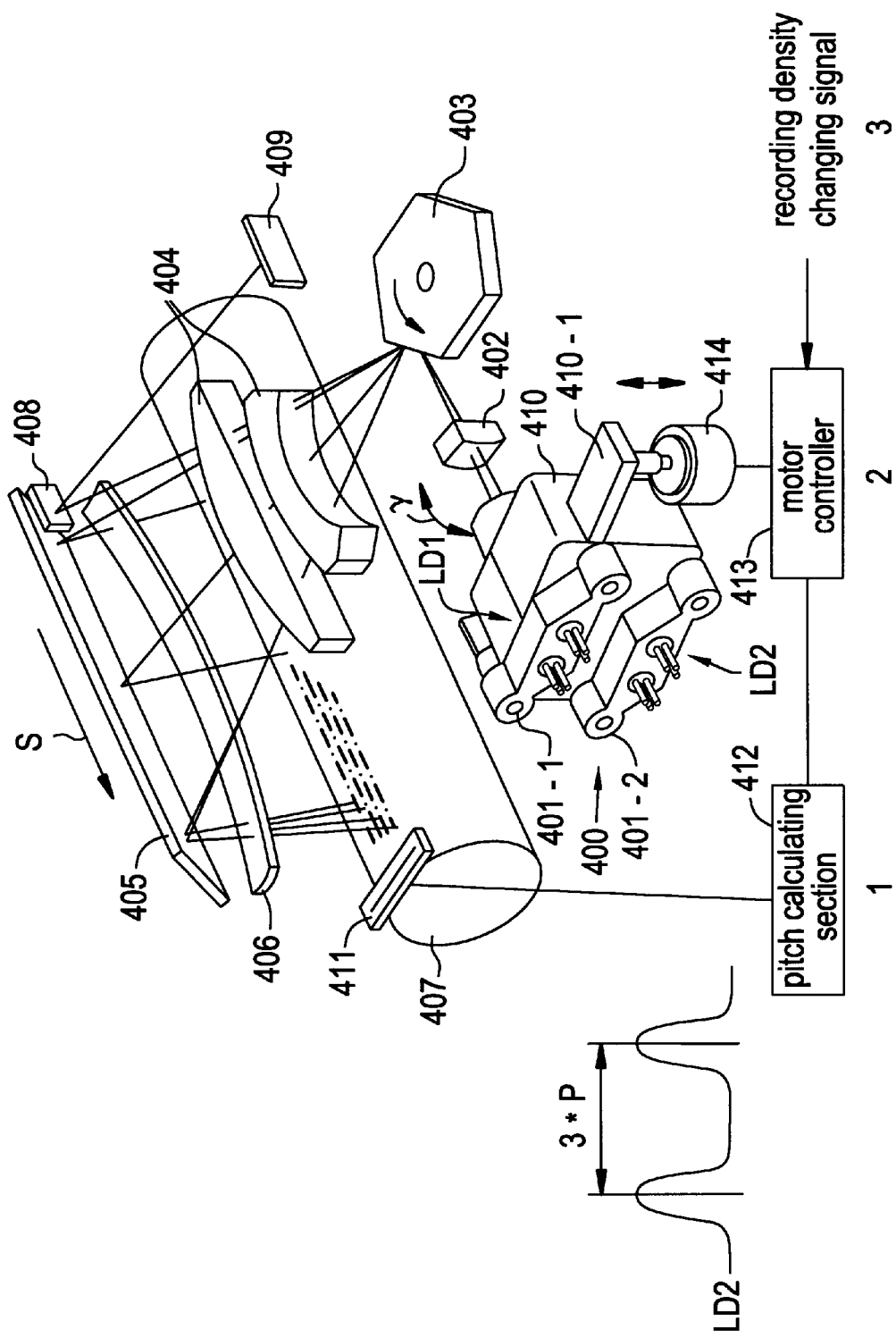
FIG. 6 is a diagram of a multi-beam optical scanning apparatus with a 4-beam light source unit according to a preferred embodiment of the present invention.

Referring now to FIG. 6, there is shown an outline of a multi-beam optical scanning apparatus with a 4-beam light source unit preferably having the same construction and arrangement as the preferred embodiment in FIG. 3.

Respective beams emitted from a light source unit 400 intersect each other in the vicinity of a reflecting position on a polygon mirror 403 via a cylinder lens 402, and then deflected for scanning by the polygon mirror 403. After respective beams pass an fθ lens 404 composed of two lenses, they are reflected toward a photosensitive drum 407 via a turn-back mirror 405. The beam then forms images on the photosensitive drum 407 via a toroidal lens 406 and then four lines adjacent to each other are written by the respective beams simultaneously at a predetermined pitch P in the sub-scanning direction. In addition, a mirror 408 for detecting a synchronization amount is provided outside of an image area of the turn-back mirror 405, and beams reflected by the mirror 408 are detected by a synchronization detecting sensor 409 so as to detect a scanning starting position in a main scanning direction S of each beam.

Referring to a preferred embodiment in which beam spots LD1-R and LD1-L of the first light source section LD1 and beam spots LD2-R and LD2-L of the second light source section LD2 are set in an arrangement at intervals in the main scanning direction as shown in FIG. 8, the beams are incident in time series on the synchronization detecting sensor 409 and therefore, the writing timing is taken individually by separating detecting signals of respective beams. If the beam spots are not spaced at specific intervals in the main scanning direction, it is possible to detect a beam which first passes the synchronization detecting sensor 409 and then delaying other beams at a given amount of time to determine the timing thereof.

In a scanning end position in the vicinity of the photosensitive drum 407, a linear sensor 411 is disposed so as to extend toward the sub-scanning direction for determining if the scanning line intervals are changed by environmental changes or a component substitution or adjustment and correcting the intervals, when the intervals are changed, so as to always precisely and accurately maintain a desired constant interval value. For example, only two beams of the second light source section LD2 are turned on and the beam-to-beam pitch is measured. This measured value is ideally 3 times (3P) a recording pitch P in the arrangement in FIG. 8. Therefore, a value of a deflection of the measured value from 3P is calculated by a pitch calculating section 412 comparing the measure value with 3P. The calculation result (the deflection value) is transmitted to a control section 413, and then a stepping motor 414 is driven to rotate a mounting member 410 of a light source unit 400 by an angle corresponding to the deflection (a converted value) via the motor control section 413. The mounting member 410 of the light source unit 400 is rotated in a γ direction around a light emitting axis functioning as a center of the rotation by causing upward or downward movement of a lever 410-1 connected to the mounting member 410, by which it is possible to accurately and easily correct the deflection of the recording pitch P in the sub-scanning direction.

In addition, if a recording pitch P to be set is switched to another pitch after receiving a recording density variable signal from an operating section or the like which is not shown, the stepping motor 414 is driven by the motor control section 413 in the same manner in order to change the recording pitch P in the sub-scanning direction.

In the above preferred embodiment, the pitch P in the sub-scanning direction is changed by disposing the beam spots symmetrically relative to the light emitting axes a1 and a2 of the first and second light source sections LD1 and LD2, the light emitting axes a1 and a2 being coincident with each other, and rotating the mounting member 110 with the light emitting axes a1 and a2 matched to the rotational center C of the mounting member.

The preferred embodiments of the present invention are not limited to such an arrangement, however, and as shown in FIG. 8, it is also possible to change the pitch P by rotation around the rotational center C of the mounting member 110 with the light emitting axes a1 and a2 of the first and second light source sections LD1 and LD2 symmetrically disposed relative to the rotational center C of the mounting member and the inclinations θ1 and θ2 in the sub-scanning direction of the first and second light source sections LD1 and LD2 adjusted so that the beam spots LD1-R, LD1-L, LD2-R, and LD2-L are arranged in series.

Further, although there is shown an example of using two semiconductor lasers each for the first light source section LD1 and the second light source section LD2 in the preferred embodiment shown in FIG. 3 and an example of using a single semiconductor laser for the first light source section LD1 and two semiconductor lasers for the second light source section LD2 in the preferred embodiment shown in FIG. 5, more semiconductor lasers can be used for the first and second light source sections.

Figure 11:
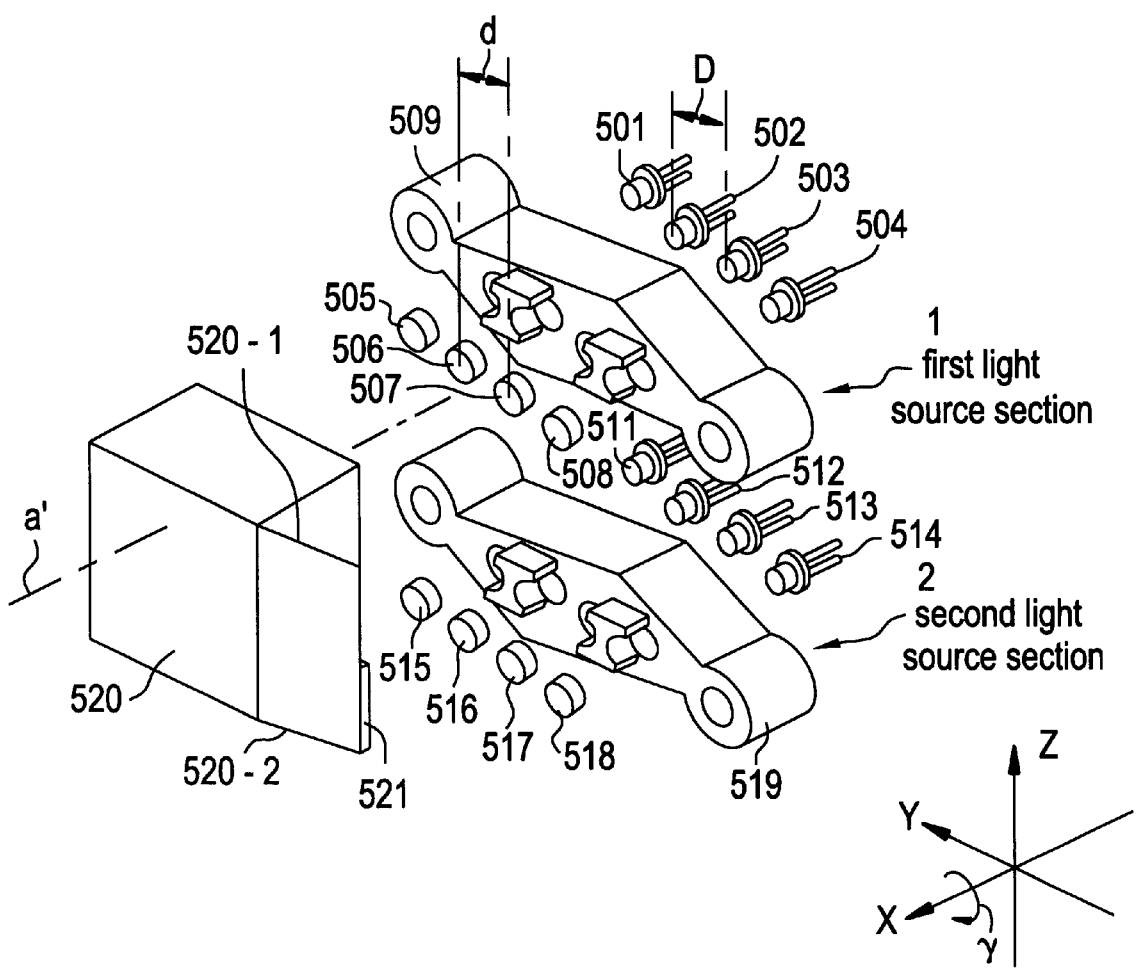
FIG. 11 is a constitutional explanatory diagram illustrating a multi-beam light source unit according to another preferred embodiment of the present invention including an 8-beam light source unit having a total eight general-purpose semiconductor lasers.

Referring to FIG. 11, there is shown a preferred embodiment in which more semiconductor lasers are used for the first and second light source sections, illustrating an example of a 8-beam light source unit having a total of eight general-purpose semiconductor lasers. The first light source section LD1 includes four semiconductor lasers 501, 502, 503, and 504 and four collimating lenses 505, 506, 507, and 508 which are provided so as to be paired with the semiconductor lasers 501, 502, 503, 504 for collimating light beams. The four semiconductor lasers 501–503 and the four collimating lenses 505–508 are arranged in a main scanning direction (a Y direction in FIG. 11), respectively, and are integrally supported on a supporting member 509. In the same manner, the second light source section LD2 includes four semiconductor lasers 511, 512, 513, and 514 and four collimating lenses 515, 516, 517, and 518 for collimating light beams emitted by the lasers 511–514, which collimators 515–518 are paired with the semiconductor lasers 511–514. The semiconductors 511–514 and the collimating lenses 515–518 are disposed in the main scanning direction and are integrally supported on a supporting member 519. In addition, the first and second light source sections and a beam synthesizing prism 520 are integrally mounted onto a mounting member (not shown in FIG. 11) preferably having the same construction and arrangement as the preferred embodiment shown in FIG. 3.

The beam synthesizing prism 520 has a polarizing beam splitter surface 520-1 inside in the same manner as the beam splitter shown in FIG. 3, and a ½ wavelength plate (λ/2 plate) 521 is provided on a surface on which a beam from the second light source section LD2 is incident in addition to a reflective surface 520-2 which reflects a beam from the second light source section LD2. Four beams from the first light source section LD1 are emitted so as to pass directly through the polarizing beam splitter surface 520-1, and four beams from the second light source section LD2 are reflected upward by an inclined surface 520-2 with its polarization direction rotated by 90 degrees via the ½ wavelength plate 521 and further reflected by the polarizing beam splitter surface 520-1 before emission. As a result of this arrangement, the plurality of beams from the two light source sections can be easily synthesized at a lower loss of light volume.

Figure 12:
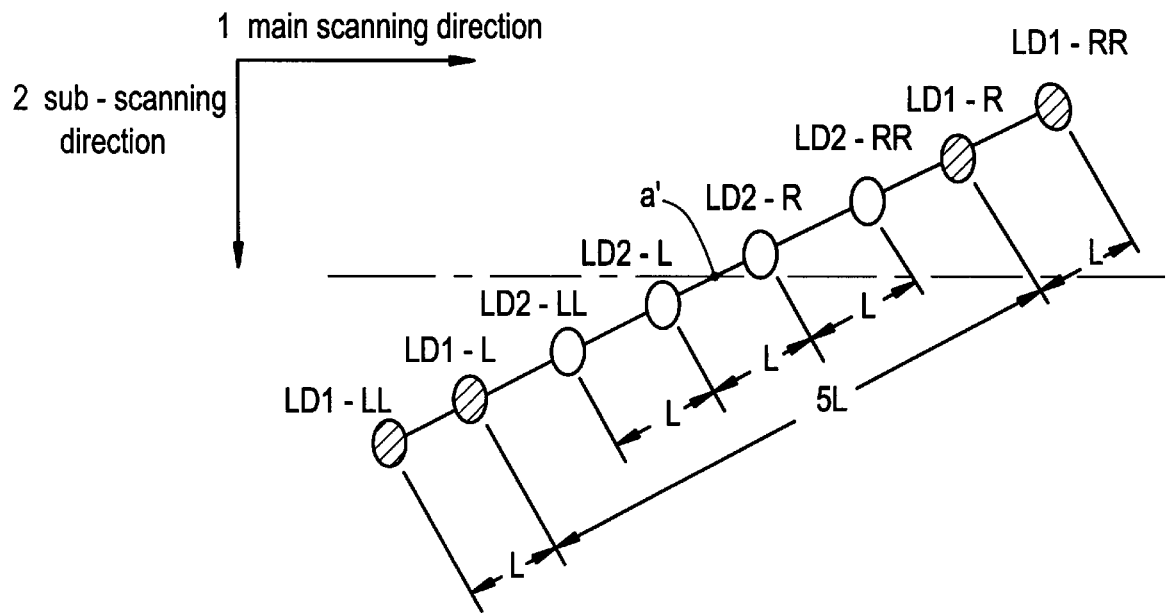
FIG. 12 is a diagram illustrating an example of beam spots arranged on a surface to be scanned when four semiconductor lasers are used each for the first and second light source sections according to a preferred embodiment of the present invention.

Referring to FIG. 12, there is shown an example of beam spots arranged on the photosensitive surface when four semiconductor lasers are used each for the first and second light source sections. In this example, an interval between beam spots LD1-R and LD1-L, between which the light emitting axis C is located, among four beam spots LD1-R, LD1-RR, LD1-L, and LD1-LL from the first light source section LD1 in FIG. 11, is preferably set so as to be about five times an interval L between four beam spots LD2-R, LD2-RR, LD2-L, and LD2-LL from the second light source section LD2 by setting a different ratio D/d of a semiconductor laser interval (an interval between the adjacent semiconductor lasers 502 and 503 between which the light emitting axis C is located) D to a collimating lens interval (an interval between the adjacent collimating lenses 506 and 507 between which the light emitting axis C is located) d, and then a beam spot array of the second light source section LD2 is arranged therebetween. An interval between the beam spots LD1-R and LD1-RR and between LD1-L and LD1-LL from the first light source section LD1 is L. The beam spots from the first and second light source sections can be spaced at equal intervals L in a straight line without any overlapping by these settings, and therefore, a scanning line interval (the recording density pitch) P in the sub-scanning direction can be reliably changed by such a simple adjustment process such that the light source unit is rotated around the light emitting axis C (the rotational center of the mounting member which is not shown).

While there are many adjustment methods other than the methods described above if a plurality of the beam spot intervals of the first and second light source sections are to be changed, such methods may require complicated processes which cause errors and process mistakes due to confusion. Therefore, only a method which requires minimum changes of the intervals is disclosed herein. However, other methods of adjustment are possible and within the scope of the present invention.

Figure 13:
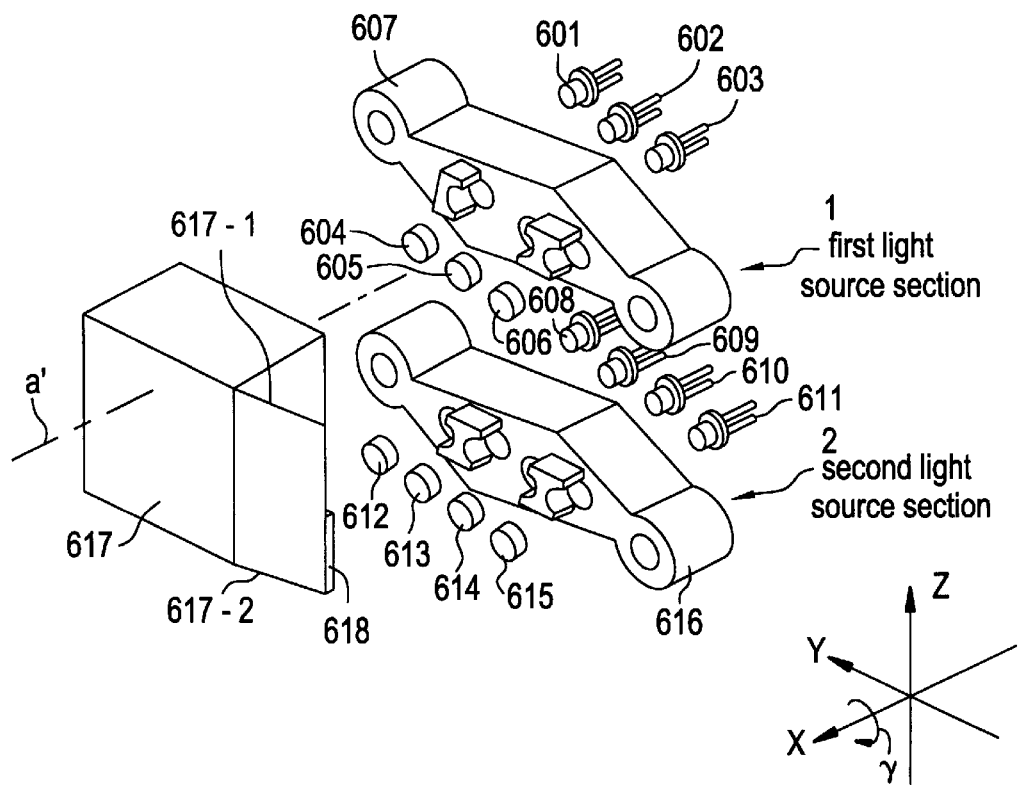
FIG. 13 is a constitutional explanatory diagram illustrating a multi-beam light source unit according to another preferred embodiment of the present invention, in which more semiconductor lasers are used for the first and second light source sections and including a 7-beam light source unit having a total of seven general-purpose semiconductor lasers.

Next, referring to FIG. 13, there is shown another preferred embodiment of a constitution in which more semiconductor lasers are used for the first and second light source sections, illustrating an example of a 7-beam light source unit having a total of seven general-purpose semiconductor lasers. The first light source section LD1 includes three semiconductor lasers 601, 602, and 603 and three collimating lenses 604, 605, and 606 for collimating light beams which are paired with the semiconductor lasers 601–603. These semiconductor lasers 601–603 and collimating lenses 604–606 are disposed in a main scanning direction (a Y direction in FIG. 13), respectively, while being integrally supported on a supporting member 607, and with the semiconductor laser 602 and the collimating lens 605 located at the center of the first light source section LD1 arranged on the light emitting axis C and others symmetrically arranged relative to the light emitting axis C. The second light source section LD2 includes four semiconductor lasers 608, 609, 610, and 611 and four collimating lenses 612, 613, 614, and 615 for collimating light beams, which collimator lenses 608–611 are paired with the semiconductor lasers 608–611. The semiconductor lasers 608–611 and collimating lenses 612–615 are disposed in the main scanning direction and symmetrically relative to the light emitting axis C while being integrally supported on a supporting member 616. In addition, the first and second light source sections and a beam synthesizing prism 617 are integrally mounted on a mounting member (not shown in FIG. 13) which preferably has the same construction as the mounting member shown in FIG. 5.

The beam synthesizing prism 617 has a polarizing beam splitter surface 617-1 inside in the same manner as the preferred embodiment shown in FIG. 5, and a ½ wavelength plate (λ/2 plate) 618 is provided on a surface on which a beam from the second light source section LD2 is incident in addition to a reflective surface 617-2 which reflects a beam from the second light source section LD2. Three beams from the first light source section LD1 are emitted so as to pass through the polarizing beam splitter surface 617-1, and four beams from the second light source section LD2 are reflected upward by an inclined surface 617-2 with its polarization direction rotated by 90 degrees via the ½ wavelength plate 618 and further reflected by the polarizing beam splitter surface 617-1 before emission. As a result of this arrangement, the plurality of beams from the two light source sections can be easily synthesized at a lower loss of light volume.

Figure 14:
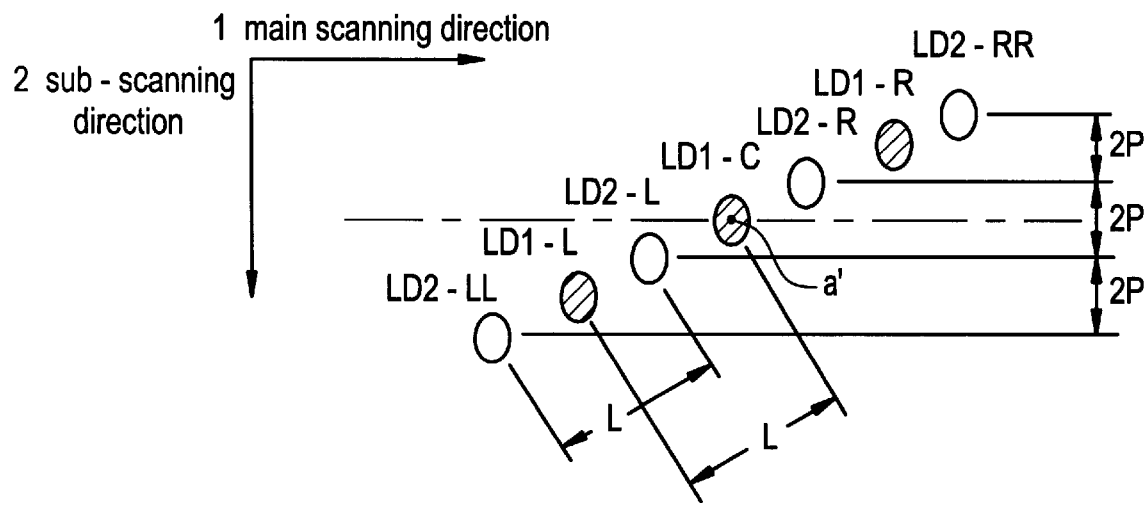
FIG. 14 is a diagram illustrating an example of beam spots arranged on a surface to be scanned when three semiconductor lasers are used for the first light source section and four semiconductor lasers are used for the second light source section according to a preferred embodiment of the present invention.

Referring to FIG. 14, there is shown an example of beam spots arranged on a photosensitive surface when three semiconductor lasers are used for the first light source section LD1 and four semiconductor lasers are used for the second light source section LD2. In this example, beam spots from the first and second light source sections are alternately arranged at equal intervals with an interval L each between three beam spots LD1-R, LD1-C, and LD1-L from the first light source section LD1 in FIG. 13 and an interval L defined between each of the four beam spots LD2-R, LD2-RR, LD2-L, and LD2-LL from the second light source section LD2.

In this manner, for a combination of the first and second light source sections having odd-numbered semiconductor lasers and even-numbered semiconductor lasers, as shown in FIG. 14, the beam spots from the first and second light source sections can be alternately arranged at equal intervals. Therefore, a pitch P in the sub-scanning direction can be changed in proportion to a rotational angle by simply rotating the mounting member around the light emitting axis C functioning as a rotational center. If only a single light source section is provided, because the beam spot interval L corresponds to the semiconductor laser interval, there is a restriction in that the semiconductor lasers or collimating lenses themselves are required to be reduced in size to obtain a shorter beam spot interval L. In the constitutions shown in FIGS. 13 and 14, however, the beam spots from the first and second light source sections are alternately arranged, and therefore, even if the beam spot interval of each light source section is L (pitch 2P in the sub-scanning direction), a practical beam spot interval after synthesizing the beams becomes L/2 (pitch P in the sub-scanning direction), by which the number of beams can be increased by a given element size, in other words, the multi-beam light source unit can be reduced in size.

The preferred embodiment shown in FIG. 5 is an example of a combination of the first and second light source sections having odd-numbered semiconductor lasers and even-numbered semiconductor lasers, one of the light source sections having a pair of the semiconductor lasers and the collimating lens. Accordingly, it is not necessary to adjust an angle θ of the first and second light source sections and the beam spots are arranged in a straight line on the surface of the photosensitive body simply by incorporating the light source sections into the mounting member, such that excellent assembly properties and minimum eccentricity of the semiconductor lasers relative to the collimating lenses are obtained. Therefore, even a conventional optical system for recording with a single beam can be used as it is by merely replacing the light source unit.

In the preferred embodiments of the present invention as set forth in the above, a beam synthesizer may include a ½ wavelength plate for converting phases in the polarizing direction of the plurality of beams at a time only from the second light source section in the first and second light source sections and a beam synthesizing prism (111, 211, 520, or 617) having a polarizing beam splitter surface for emitting a plurality of beams passing the ½ wavelength plate and matched to the beams emitted from the first light source section.

Figure 15:
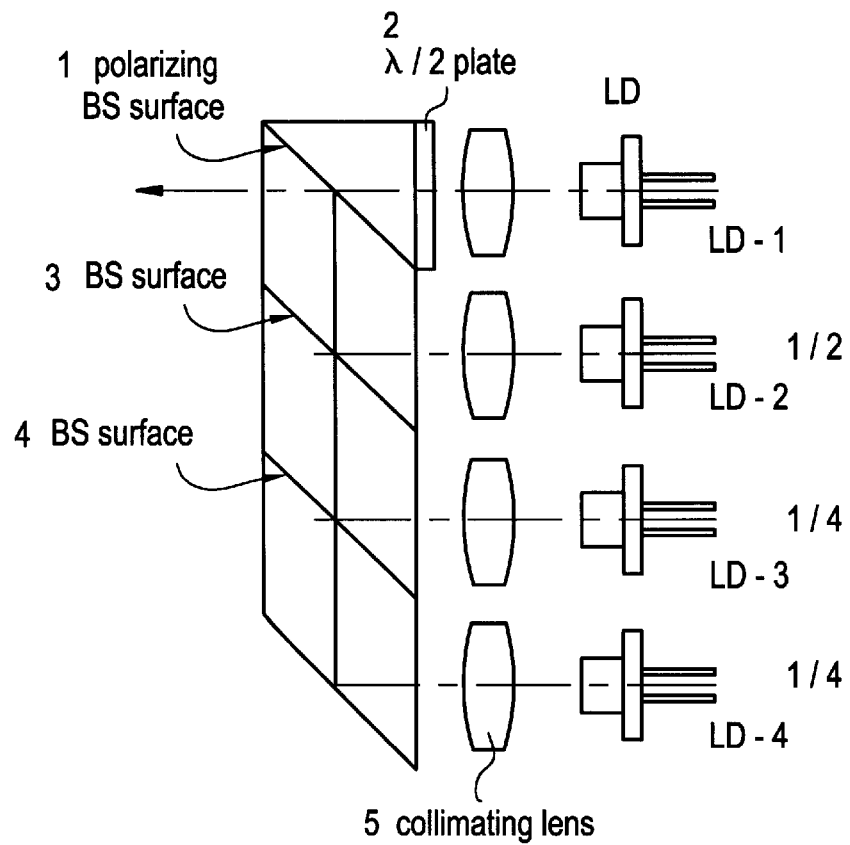
FIG. 15 is a diagram illustrating an example of synthesizing beams by causing beams to pass the beam splitter surface a plurality of times by using optical elements having a beam splitter surface (BS surface) disposed in a plurality of stages in parallel.

To increase the number of beams in the conventional beam synthesizing method, as shown in FIG. 15, for example, there is a method for directing beams to pass the beam splitter surface a plurality of times by using optical elements having the beam splitter surface (BS surface) disposed in a plurality of stages in parallel. Generally, the light volume transmitted and reflected by the beam splitter surface is divided into halves for each, and therefore, assuming that a beam from the first semiconductor laser LD-1 is reflected with a phase of the polarizing direction rotated by 90 degrees by using a ½ wavelength plate (λ/2 plate) so as to pass the polarizing beam splitter surface (polarizing BS surface) which is the final synthesizing surface, the amount of light emitted from the polarizing beam splitter surface which is the final synthesizing surface differs between the semiconductor lasers. Namely, the emitted light volume of the second semiconductor laser LD-2 is one half of the light volume of the emitted light volume 1 of the first semiconductor laser LD-1 since the beam from the second semiconductor laser LD-2 passes one more BS surface, and the emitted light volumes of the third and fourth semiconductor lasers are one fourth of the light volume of the emitted light volume 1 since the beams from the third and fourth semiconductor lasers LD3 and LD-4 pass two more BS surfaces. Thus, a light volume loss is increased as the number of beams is greater, which is a limitation in an output of semiconductor lasers.

Contrary to this, in the beam synthesizing device used in the preferred embodiments of the present invention, a plurality of beams from the first and second light source sections pass through the polarizing beam splitter surface only once, and therefore, there is almost no loss of light volume. Consequently, the number of beams can be increased at the minimum light emitting output. Thus, a multi-beam light source unit having a plurality of beams can be achieved by using general-purpose semiconductor lasers like a 3-beam, 4-beam, 7-beam, or 8-beam light source unit shown in the above preferred embodiments.

In the basic constitution set forth in the above description, unless the light emitting axes of the light source sections are parallel to each other in the sub-scanning direction as described later, a point on the photosensitive drum where the light emitting axis reaches is deviated toward the sub-scanning direction and a pitch adjustment cannot be precisely performed.

Accordingly, in a preferred embodiment shown in FIG. 16, light source sections are disposed so as to be spaced at a predetermined interval m (for example, about 1 mm) so that light emitting axes a1 and a2 are not matched to each other in the main scanning direction, and the light emitting axes a1 and a2 are not parallel to each other and set symmetrically relative to a rotational reference C of the mounting member 203 (an optical axis of the scanning optical system shown in FIG. 6 being the rotational reference), which is described later, having a predetermined angle α in the intersecting direction. In other words, as shown in FIG. 4, the light emitting axis a1 of the first light source section LD1 is arranged apart from the light emitting axis a2 of the second light source section LD2 at the predetermined angle α in the main scanning direction), such that the light emitting axes a1 and a2 are also spaced at a predetermined interval on a scanned surface.

In this preferred embodiment, the light emitting axes are disposed apart from each other at the predetermined angle α in the main scanning direction by inclining a supporting surface 110-3 (110-4) of a base member which is used as a mounting reference surface for the light source sections by α/2 for each (α1=a2).

In the optical scanning system (FIG. 6) of the preferred embodiment described later, the interval M between the light emitting axes a1 and a2 on the scanned surface is preferably set to, for example, approximately 1 mm. This magnification depends upon an optical scanning system.

Figure 16:
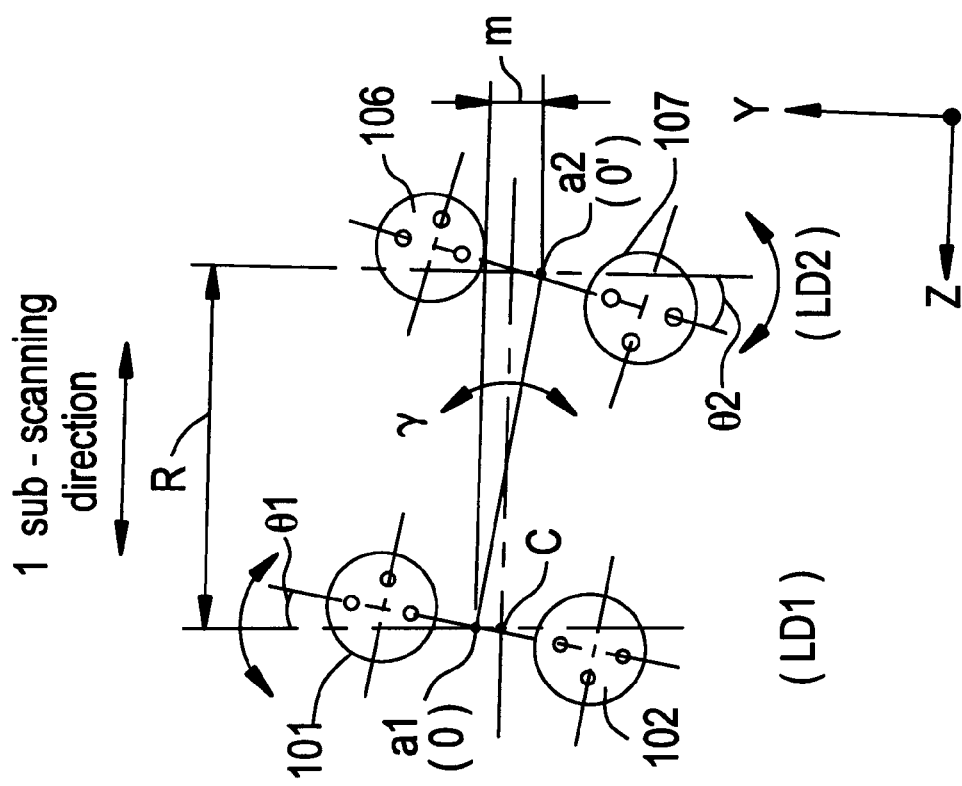
FIG. 16 is a diagram of the 4-beam light source viewed from the back side in the X direction, illustrating an arrangement of semiconductor lasers according to a preferred embodiment of the present invention.
Figure 17A:
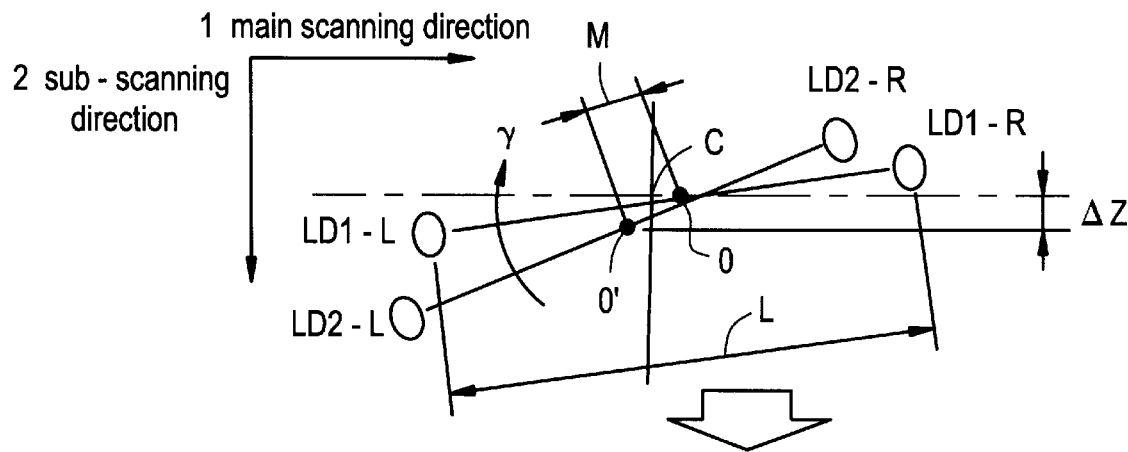
FIG. 17(a) and FIG. 17(b) are diagrams illustrating an example of beam spots arranged on a surface to be scanned and an example of adjusting a pitch between beam spots in a sub scanning direction in the multi-beam light source unit with a 4-beam light source unit in which semiconductor lasers are arranged as shown in FIG. 16 according to a preferred embodiment of the present invention.
Figure 17B:
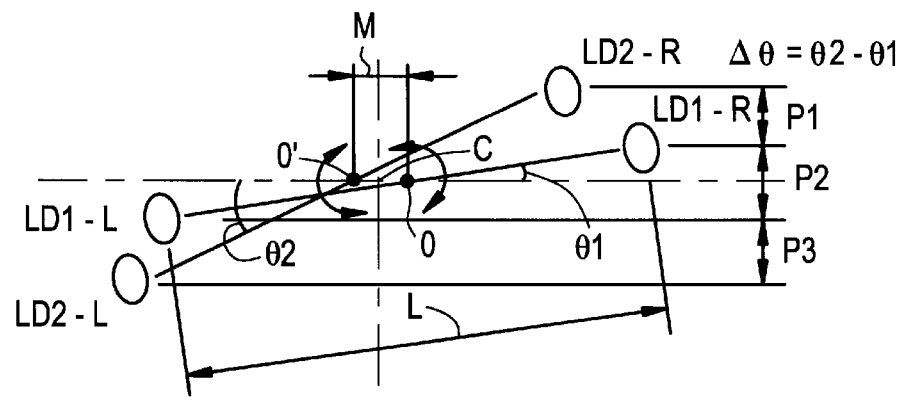

A pitch in the sub-scanning direction on the scanned surface is adjusted by adjusting an inclination θ1 made by the semiconductor lasers 101 and 102 of the first light source section LD1 and an inclination θ2 made by the semiconductor lasers 106 and 107 of the second light source section LD2, respectively with two mating holes on the base member as references (in other words, as shown in FIG. 16, with the light emitting axes a1 and a2 as references) when each of the light source sections LD1 and LD2 is fixed to the base member (not shown). As shown in FIG. 17(a), however, points where the light emitting axes a1 and a2 reach on the scanned surface, O and O', (O is a midpoint of two beam spots LD-1 and LD1-R from the first light source section LD1 and O' is a midpoint of two beam spots LD2-L and LD2-R from the second light source section LD2) do not match due to a slight deviation in the sub-scanning direction caused by an error in a precision of parts, such as a beam synthesizing prism, and the beam spot positions from the light source sections are shifted by ΔZ in the sub-scanning direction. Accordingly, after a holding member (the mounting member 110 and the base member (not shown)) is rotated in a γ direction around the rotational reference C (an optical axis of the scanning optical system) shown in FIGS. 16 and 17(a) so as to match the light emitting axes reaching points O and O' on the scanned surface as shown in FIG. 17(b), the inclinations θ1 and θ2 of the first and second light source sections LD1 and LD2 are adjusted around the points O and O' as rotational centers, respectively, in order to adjust the sub-scanning pitch. Then, the light source sections are fixed to the base member.

The base member is held onto an optical housing (not shown) which contains the scanning optical system shown in FIG. 6 via the mounting member 110. A cylindrical section 110-1 which is the rotational reference C is mounted onto the mounting member 110 and the cylindrical section 110-1 is positioned so as to be engaged with a hole portion of the optical housing which is not shown with the rotational reference C of the cylindrical section 110-1 matched to an optical axis of the scanning optical system before it is mounted as a light source unit 400. However, due to an error of parallelism of a toroidal lens or other such lenses, for example, for each scanning optical system, a practical scanning line does not match a horizontal line of the light source unit 400 in some cases, and it occurs that a pitch P2 between the beam spots LD1-R and LD1-L is not obtained though it is possible to obtain a pitch P1 between the beam spots LD2-R and LD1-R and a pitch P3 between the beam spots LD1-lL and LD2-L. In these cases, since Δθ(=θ2−θ1) maintains a given value, in this preferred embodiment, the mounting member 110 is rotatably mounted onto the optical housing in the cylindrical section 110-1 and a lever 110-2 is removably attached to a side of the mounting member 110, and the pitch P2 is corrected by adjusting the inclinations θ2 and θ1 by moving the lever 110-2 up and down with a motor or the like to rotate the mounting member 110 around the rotational reference C functioning as a rotational center therefor. If the interval M between the light emitting axis reaching points O and O' of the light source sections is large relative to the beam spot interval L of the first light source section LD1, P1 and P3 also change together with the correction of the pitch P2 between the beam spots in the sub-scanning direction. Therefore, these changes of P1 and P2 must be limited to an extent such that they will not affect an image quality. Since about ¼ of a pitch P is generally considered to be allowable as a change of the pitch in the sub-scanning direction, it is preferable to set the interval M between the light emitting axis reaching points O and O' on the scanned surface to about ¼ or smaller of the interval L between the beam spots from the light source sections. In an example of this preferred embodiment, the interval L between the beam spots from the light source sections is set to about 8 mm, the interval M between the light emitting axis reaching points O and O' on the scanned surface is set to about 1 mm, and the change of the pitch in the sub-scanning direction is set to about ⅛ of the interval L.

As set forth above, an explanation has been made for the preferred embodiments of a 4-beam light source unit having four semiconductor lasers and the optical scanning apparatus in which the 4-beam light source unit is mounted.

Next, as another preferred embodiment of the present invention, a 3-beam light source unit shown in FIG. 5 will be described. As apparent relative to FIG. 3, the 3-beam light source unit shown in FIG. 5 is configured in the same manner as the 4-beam light source unit shown in FIG. 3 except for a constitution of the first light source section LD1. In a first light source section LD1 shown in FIG. 5, there is a set of a semiconductor laser 201 and a collimating lens 202, and the semiconductor laser 201 and the collimating lens 202 are disposed on the light emitting axis which is coincident with the above mentioned a1 and the laser 201 and lens 202 are supported by a supporting member 203 in the same manner. In other words, in FIG. 16, a unit of the semiconductor laser 201 and the collimating lens 202 are disposed along the light emitting axis a1 of the first light source section LD1.

Figure 18:
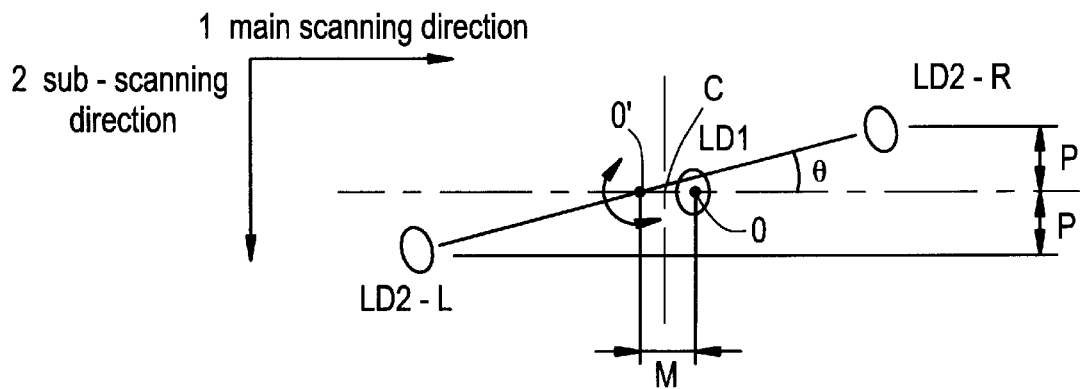
FIG. 18 is a diagram illustrating an example of an arrangement of beam spots on a scanned surface and an example of adjusting a pitch between beam spots in a sub scanning direction in the multi-beam light source unit when one semiconductor laser is used for the first light source section and two semiconductor lasers are used for the second light source section according to a preferred embodiment of the present invention.

Referring to FIG. 18, there is shown a diagram illustrating an arrangement of beam spots on a scanned surface. A light emitting axis reaching point 0 of the first light source section LD1 and a light emitting axis reaching points O' of a second light source section LD2 on the scanned surface are spaced at an interval M (for example, about 1 mm) and arranged symmetrically relative to a rotational reference C (an optical axis of the scanning optical system) having a predetermined angle (equivalent to $\alpha$ in FIG. 4) in the direction of intersecting thereof. Therefore, the beam spot from the first light source section LD1 is positioned on the light emitting axis, in other words, at the light emitting axis reaching point O which is about 0.5 mm apart from the rotational reference C.

To adjust a beam pitch P in the sub-scanning direction, a mounting member 210 is rotated around the rotational reference C to match the light emitting axis reaching point O' of the second light source section LD2 to the light emitting axis reaching point O of the first light source section LD1 in the sub-scanning direction, and then the light source sections may be fixed to a base member (not shown) after adjusting an inclination $\theta$ of a supporting member 206 (in other words, an inclination between two beam spots LD2-R and LD2-L) so as to obtain an interval 2P between the beam spots LD2-R and LD2-L in the sub-scanning direction. An adjustment is not required when the first light source section LD1 is fixed.

The 3-beam light source unit may be provided by removing one of the pair of the semiconductor lasers and the collimating lens from one light source section of the 4-beam light source unit shown in FIGS. 3 and 16. In this case, however, the semiconductor laser and the collimating lens in the light source section in the 1-beam constitution are not arranged on the light emitting axis, and therefore, both of the light source sections need to be adjusted when they are fixed to the base member in the same manner as for the 4-beam light source unit.

Next, another preferred embodiment of the present invention will be described. A basic constitution of a multi-beam light source unit according to the present preferred embodiment is the same as the one for the 4-beam light source unit having at total of four general-purpose semiconductor lasers as shown in FIG. 3 or for the 3-beam light source unit having a total of three general-purpose semiconductor lasers as shown in FIG. 5. An optical scanning apparatus according to this preferred embodiment preferably has the same constitution as the optical scanning apparatus shown in FIG. 6.

First, an explanation will be made by giving an example for the 4-beam light source unit shown in FIG. 3.

Figure 19A:
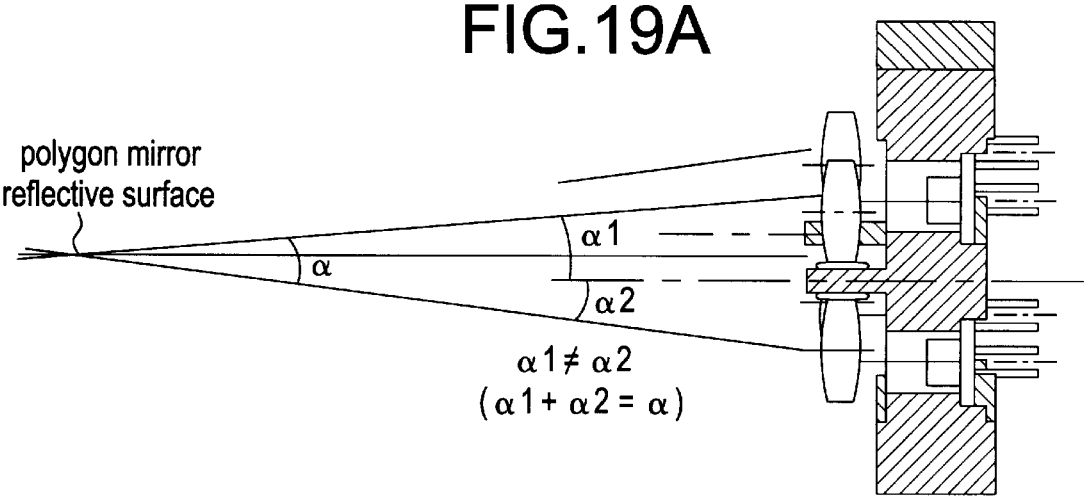
FIGS. 19(a), 19(b) and 19(c) are diagrams illustrating an example of light emitting axes of light source sections spaced from each other at a given interval according to a preferred embodiment of the present invention.
Figure 19B:
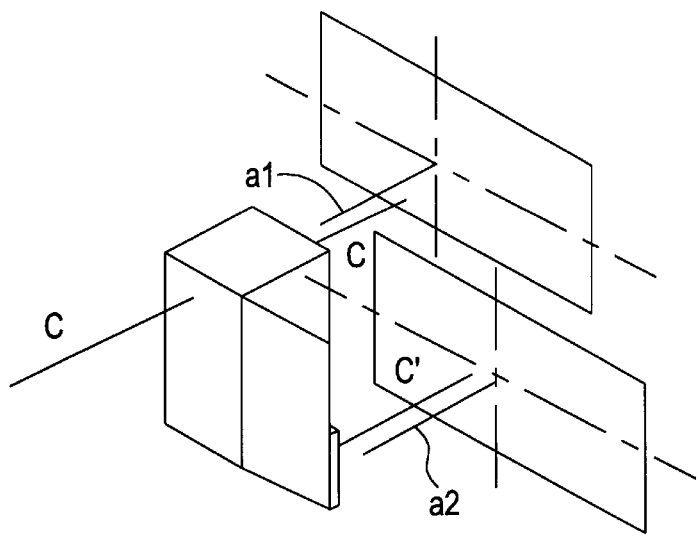
Figure 19C:
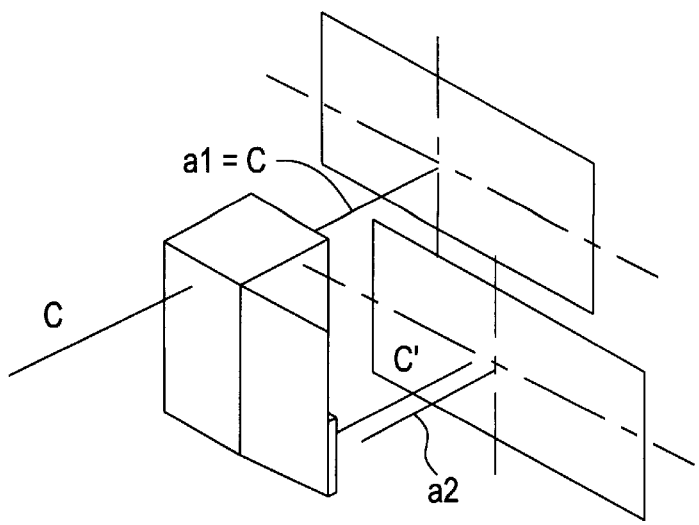

In this preferred embodiment, as shown in FIG. 19(a), main light beams from respective semiconductor lasers are emitted symmetrically relative to the light emitting axes in their intersecting direction at a predetermined angle ($\alpha1 \neq \alpha2$) and the beam emitting directions are set so that the beams intersect each other near a reflective surface of a polygon mirror.

Figure 20:
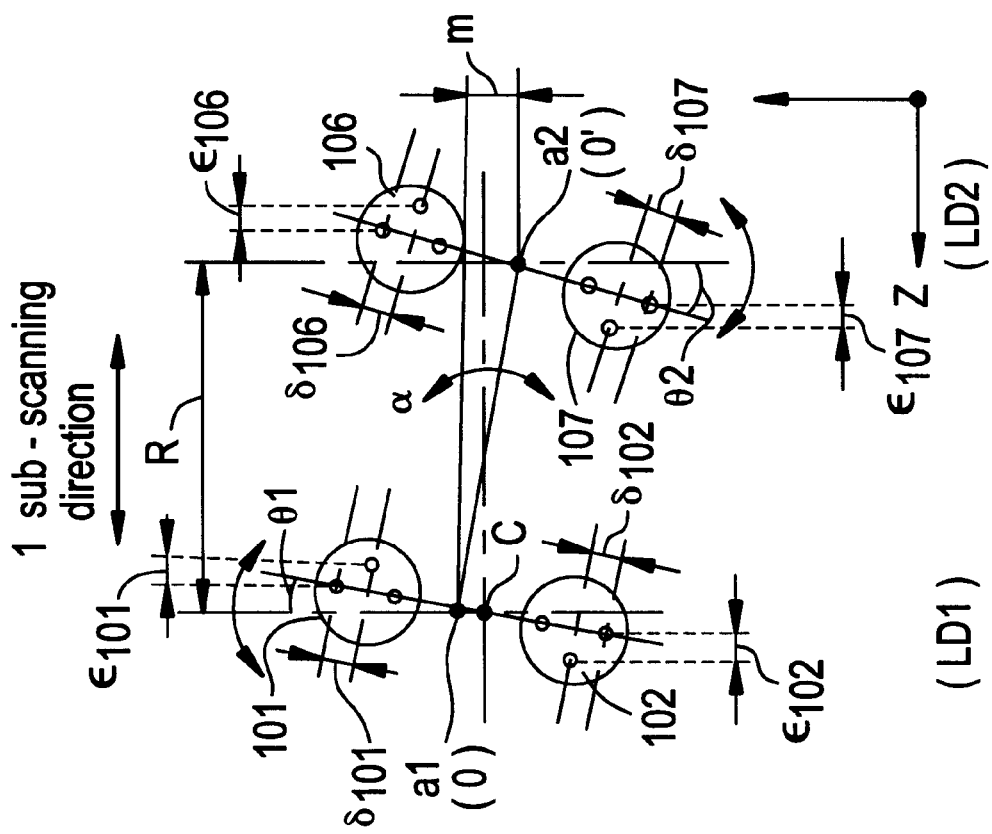
FIG. 20 is a diagram of the 4-beam light source viewed from the back side in the X direction, illustrating shift amounts of the semiconductor lasers according to a preferred embodiment of the present invention.

In other words, it is possible to cause light beams emitted from all the semiconductor lasers to intersect each other in the main scanning direction in the vicinity of the polygon mirror reflective surface by individually adjusting shift amounts of the semiconductor lasers from optical axes of the collimating lenses paired with the semiconductor lasers. As shown in FIG. 20, $\delta101$, $\delta102$, $\delta106$, and $\delta107$ designate shift amounts of the semiconductor lasers 101; 102, 106, and 107, and $\epsilon101$, $\epsilon102$, $\epsilon106$, and $\epsilon107$ designate components in the sub-scanning direction of the shift amounts. This adjustment also makes it possible to match the central points O and O' of the beam spots of the light beams from the light source sections LD1 and LD2 to the optical axis C on a scanned surface. If this adjustment is applied, however, the semiconductor lasers supported at the positions which are symmetrical relative to the light emitting axes a1 and a2 of the two light source sections LD1 and LD2 will have different amounts of shift from the collimating lens optical axes.

Figure 23:
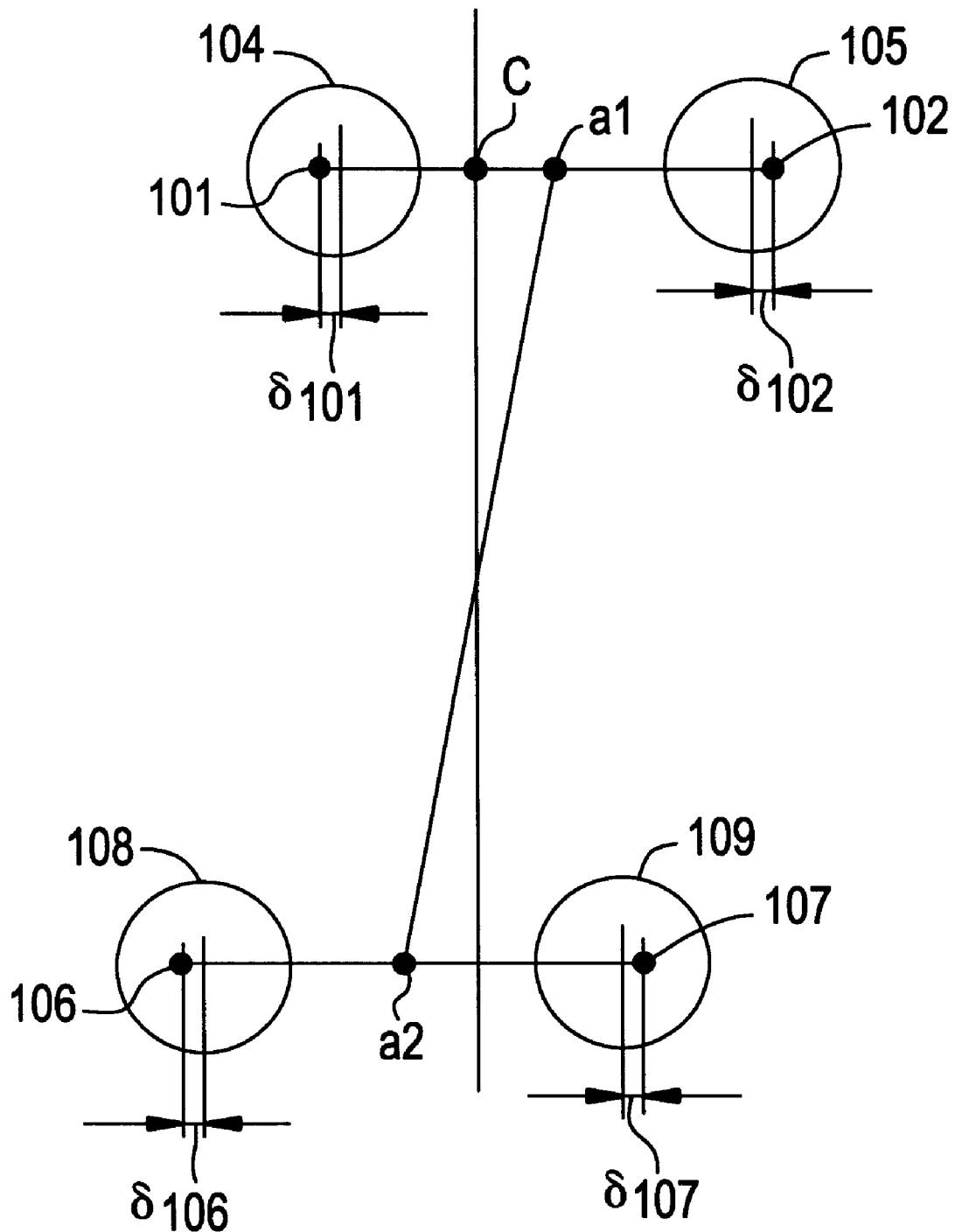
FIG. 23 is a diagram for explaining shifts in an amount of semiconductor lasers from an optical axis of collimating lenses according to a preferred embodiment of the present invention.

Specifically, referring to FIG. 23, the shift amounts for the semiconductor lasers 101, 102, 106, and 107 from the optical axes of collimating lenses 104, 105, 108, and 109, can be set so that the light beams intersect the optical axis C in the main scanning direction near the polygon mirror reflective surface. In this condition, however, there is a deviation of about 0.5 mm between the light emitting axis a1 and the optical axis C in the main scanning direction, which causes a difference between the shift amount $\delta101$ of the semiconductor laser 101 supported by the first light source section LD1 and the shift amount $\delta102$ of the semiconductor laser 102 supported in a position symmetrical with the semiconductor laser 101 relative to the light emitting axis a1 as follows:

$$\delta101:\delta102=(4+0.5):(4-0.5)=1.3:1$$

This phenomenon is the same as for the semiconductor lasers 106 and 107 of the second light source section LD2, which are symmetrical relative to the light emitting axis a2. The shift amount ratio for these semiconductor lasers 106 and 107 is expressed by $\delta106: \delta107=1:1.3$.

Figure 21A:
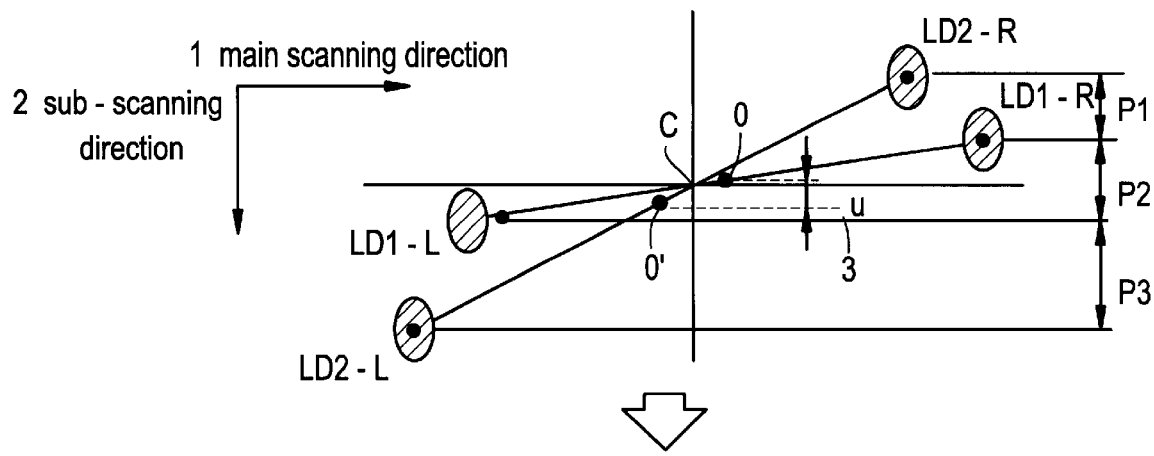
FIGS. 21(a) and 21(b) are diagrams illustrating another example of beam spots arranged on a surface to be scanned and another example of adjusting a pitch between beam spots in a sub scanning direction in the multi-beam light source unit with a 4-beam light source unit according to a preferred embodiment of the present invention.

After the adjustment of the shift amounts as described above, in order to obtain a desired pitch on the scanned surface, supporting members 103 and 103' of the two light source sections LD1 and LD2 are rotated with two mating holes on the base member (not shown) as references to obtain a pitch P2 from LD1-R and LD1-L and a pitch P1+P2+P3 from LD2-R and LD2-L as shown in FIG. 21(a).

Figure 21B:
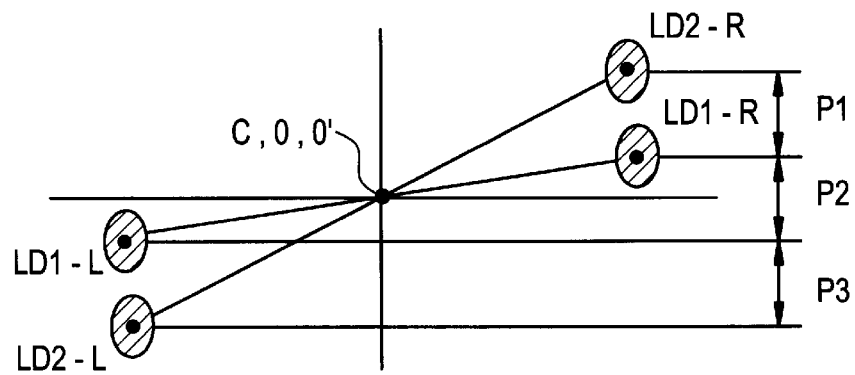

At this point, however, there is a problem that P1 and P3 are not desired pitches and are asymmetrical. It is because the different shift amounts of the semiconductor lasers in the light source side makes a difference between the components of the shift amounts caused by rotations of the light source sections LD1 and LD2 in the sub-scanning direction, in other words, $\epsilon101 \neq \epsilon102$ and $\epsilon106 \neq \epsilon107$ in FIG. 20, and by which the center between the beam spots LD1-R and LD1-L is deviated from the center o' between the beam spots LD2-R and LD2-L in the sub-scanning direction as shown in FIG. 21(a) while the pitches P2 and P1+P2+P3 are obtained. If this deviation is reduced to zero in the main and sub-scanning directions as shown in FIG. 21(b) to match the centers 0 and O' to the optical axis C, then the pitches P1, P2, and P3 become equal. The deviation, however, cannot be made zero only by a rotational adjustment in the light source side.

The asymmetrical pitches on the scanned surface are caused by the different shift amounts in the light source side as expressed by $\delta101 \neq \delta102$ and $\delta106 \neq \delta107$. Accordingly, this problem can be solved by equalizing $\delta101$ to $\delta102$ and $\delta106$ to $\delta107$, in other words, setting $\delta101=\delta102$ and $\delta106=\delta107$. While setting the shift amounts in this manner makes it impossible to cause all the light beams to intersect each other in the main scanning direction in the vicinity of the polygon mirror reflective surface, at least the pairs of the semiconductor lasers 101 and 102 and the collimating lenses 104 and 105 supported by the first light source section LD1 can intersect the light emitting axis a1 with the relation $\delta 101=\delta 102$ maintained, and the pairs of the semiconductor lasers 106 and 107 and the collimating lenses 108 and 109 supported by the second light source section LD2 can intersect the light emitting axis a2 with the relation $\delta 106=\delta 107$ maintained. This arrangement makes it possible to eliminate the problem of the asymmetrical sub-scanning beam pitches while minimizing unevenness in the positions of the light beams incident on the polygon mirror reflective surface in the main scanning direction. Therefore, this arrangement allows for reduction of an inner diameter of the polygon mirror.

The above explanation has been made for an apparatus in which the semiconductor lasers are previously shifted in the main scanning direction to obtain the pitches P1, P2, and P3 on the scanned surface by rotations of the light source sections LD1 and LD2. However, it is also applicable to an apparatus in which the pitches are obtained on the scanned surface by previously shifting the semiconductor lasers not only in the main scanning direction but also in the sub-scanning direction, for example, because of a requirement of limiting the rotation amounts $\theta 1$ and $\theta 2$ of the supporting members 103 and 103' of the first and second light source sections LD1 and LD2 to smaller amounts or a requirement of inhibiting the rotations for some reason.

Further, this adjustment method is effective for a multi-beam light source unit in which two or more evennumbered semiconductor lasers and collimating lenses are arranged and held in the first light source section LD1 and the second light source section LD2.

In other words, by setting the shift amounts of the semiconductor lasers supported by the first light source section and disposed symmetrically relative to the light emitting axis a1, as shown in FIG. 11, so as to have relations $\delta 11=\delta 12$, $\delta 13=\delta 14$, $\delta 15=\delta 16$, - - - and the shift amounts of the semiconductor lasers supported by the second light source section and disposed symmetrically relative to the light emitting axis a2 so as to have relations $\delta 21=\delta 22$, $\delta 23=\delta 24$, $\delta 25=\delta 26$, - - - , it becomes possible to cause the light beams emitted from the semiconductor lasers supported by the first light source section to intersect the light emitting axis a1 and to cause the light beams emitted from the semiconductor lasers supported by the second light source section to intersect the light emitting axis a2, respectively, in the vicinity of the polygon mirror reflective surface in the main scanning direction, and further, possible to obtain scanning lines spaced at equal intervals at a desired pitch on the scanned surface in the sub-scanning direction.

It is because the semiconductor lasers and the collimating lenses are disposed symmetrically relative to the light emitting axis a1 for the first light source section and the semiconductor lasers and the collimating lenses are disposed symmetrically relative to the light emitting axis a2 for the second light source section, and therefore, if Y-direction components (main scanning direction components) of the shift amounts from the collimating lens optical axis of the semiconductor lasers disposed symmetrically relative to the light emitting axes a1 and a2 have equal amounts (in other words, $\zeta 11=\zeta 12$, $\zeta 13=\zeta 14$, $\zeta 15=\zeta 16$, - - - , $\zeta 21=\zeta 22$, $\zeta 23=\zeta 24$, $\zeta 25=\zeta 26$, - - - ), the light beams of the semiconductor lasers supported by the first light source section intersect the light emitting axis a1 and the light beams of the semiconductor lasers supported by the second light source section intersect the light emitting axis a2 in the vicinity of the polygon mirror reflective surface.

Under these conditions, the relations $\delta 11=\delta 12$, $\delta 13=\delta 14$, $\delta 15=\delta 16$, - - - and $\delta 21=\delta 22$, $\delta 23=\delta 24$, $\delta 25=\delta 26$, - - - of the shift amounts from the collimating lens optical axis of the semiconductor lasers and the relations 411=412, $\zeta 13=\zeta 14$, $\zeta 15=\zeta 16$, - - - and $\zeta 21=\zeta 22$, $\zeta 23=\zeta 24$, $\zeta 25=\zeta 26$, - - - of the main scanning direction components of the shift amounts are satisfied, and therefore naturally relations $\epsilon 11=\epsilon 12$, $\epsilon 13=\epsilon 14$, $\epsilon 15=\epsilon 16$, - - - and $\epsilon 21=\epsilon 22$, $\epsilon 23=\epsilon 24$, $\epsilon 25=\epsilon 26$, - - - are satisfied in Z-direction components (sub-scanning direction components) of the shift amounts. Accordingly, the Z-direction components (the sub-scanning direction components) of the shift amounts have equal amounts with respect to the pairs of the semiconductor lasers and to the collimating lenses disposed symmetrically relative to the light emitting axes a1 and a2, by which a desired pitch is prevented from being asymmetrical on the scanned surface. These relations are maintained after further rotating the light source sections from this state.

Next, an explanation will be made for the 3-beam light source unit as shown in FIG. 5. The 3-beam light source is the same as the 4-beam light source unit only except for the constitution of the first light source section as apparent from FIG. 5. In the first light source section LD1, the semiconductor laser 201 and the collimating lens 202 are disposed on the light emitting axis, supported by the supporting member 203. In the second light source section LD2, the semiconductor lasers 204 and 205 and the collimating lenses 207 and 208 are disposed on the light emitting axis symmetrically relative to the light emitting axes, supported by the supporting member 206.

Figure 22:
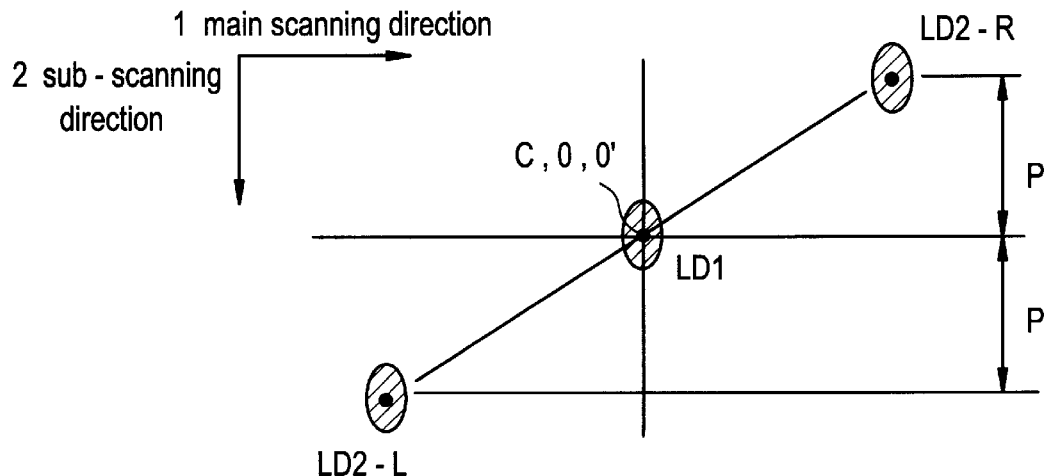
FIG. 22 is a diagram illustrating another example of beam spots arranged on a surface to be scanned and another example of adjusting a pitch between beam spots in a sub scanning direction in the multi-beam light source unit with a 3-beam light source unit according to a preferred embodiment of the present invention.

Referring to FIG. 22, there is shown an arrangement of beam spots on the scanned surface when the 3-beam light source unit is mounted on an optical scanning apparatus having the constitution shown in FIG. 6. To adjust a beam pitch P in the sub-scanning direction, the light source section 2 may be fixed to a base member (not shown) and an inclination of the supporting member 206 of the second light source section LD2 may be adjusted so as to obtain an interval 2P between the beam spots LD2-R and LD2-L of the light beams from the second light source section LD2. An adjustment is not required when the first light source section LD1 is fixed. Also in this preferred embodiment, the shift amounts $\delta 204$ and $\delta 205$ relative to the collimating lens optical axis of the semiconductor lasers 204 and 205 of the second light source section LD2 are adjusted to have equal amounts ($\delta 204=\delta 205$).

It is also possible to increase the number of the semiconductor lasers and the collimating lenses in each light source section so as to dispose three or more semiconductor lasers and collimating lenses in each light source section. If odd-numbered semiconductor lasers and collimating lenses are used, in the same manner as for the first light source section in the above-described 3-beam light source unit, the odd-numbered semiconductor lasers and collimating lenses may be arranged in the main scanning direction and the central semiconductor laser and collimating lens may be disposed on the light emitting axis, integrally supported by a supporting member. If even-numbered semiconductor lasers and collimating lenses are used, in the same manner as for the second light source section in the above-described 3-beam light source unit, the even-numbered semiconductor lasers and collimating lenses may be symmetrically arranged relative to the light emitting axis in the main scanning direction, integrally supported by a supporting member.

Also, when three or more semiconductor lasers and collimating lenses are arranged in each light source section and held therein, pairs of the semiconductor lasers and the collimating lenses symmetrically disposed relative to the light emitting axis may be adjusted so as to have equal shift amounts from the collimating lens optical axis of the semiconductor lasers.

The multi-beam light source unit set forth in the above description is preferably mounted as a light source in the multi-beam optical scanning apparatus having the construction shown in FIG. 6. However, explanation of the construction and operations of the apparatus and a method of detecting and correcting a beam pitch in the sub-scanning direction in the apparatus, will be omitted here to avoid repetition of previous explanation thereof.

As described above, a multi-beam light source unit according to preferred embodiments of the present invention has a light source section including a plurality of semiconductor lasers, a plurality of collimating lenses for collimating respective light beams emitted from the semiconductor lasers, and a supporting member for integrally supporting the plurality of semiconductor lasers and the plurality of collimating lenses arranged in a main scanning direction, and there is a relation expressed by $D/d \neq 1$ of a distance D between adjacent ones of the semiconductor lasers and a distance d between adjacent ones of the collimating lenses and the light source section is supported so that it can be rotated so as to change an angular position thereof. With this novel configuration, it is possible to maintain an accurate beam position and beam interval and prevent positional errors caused by environmental changes and other factors even when various combinations of a plurality of general-purpose semiconductor lasers are used, to thereby achieve a multi-beam light source unit capable of maintaining a precision of the optical axis stably and accurately adjusting a pitch in the sub-scanning direction.

A multi-beam light source unit according to another aspect of preferred embodiments of the present invention includes a first light source section having general-purpose semiconductor lasers, collimating lenses for collimating light beams from the semiconductor lasers, and a supporting member for integrally supporting the semiconductor lasers and the collimating lenses arranged along a light emitting axis, a second light source section having a plurality of semiconductor lasers, a plurality of collimating lenses for collimating respective light beams provided paired with the semiconductor lasers, and a supporting member for integrally supporting the plurality of semiconductor lasers and the plurality of collimating lenses symmetrically arranged relative to a light emitting axis, and a beam synthesizing device for emitting the light beams of the first and second light source sections so as to make the light beams closer. With such a configuration, it is possible to provide a smaller multi-beam light source unit having more beams at a low cost so as to meet the requirements of high speed and high density in recording apparatuses.

A multi-beam light source unit according to another aspect of preferred embodiments of the present invention includes a first light source section having a plurality of semiconductor lasers, a plurality of collimating lenses for collimating respective light beams provided paired with the semiconductor lasers, and a supporting member for integrally supporting the plurality of semiconductor lasers and the plurality of collimating lenses symmetrically arranged relative to a light emitting axis in a main scanning direction, a second light source section having a substantially same constitution as the first light source section, and a beam synthesizing device for emitting light beams of the first and second light source sections so as to make the light beams closer to each other. With such a construction, it becomes possible to provide a smaller multi-beam light source unit having additional light beams provided at a low cost so as to meet the requirement for high speed and high density in recording apparatuses.

In the multi-beam light source unit according to another aspect of preferred embodiments of the present invention, the light emitting axis of the first light source section and the light emitting axis of the second light source section are spaced at a given angle in the main scanning direction, by which it becomes possible to absorb a deviation of the light emitting axes caused by an error of precision in the arrangement between the light source sections or a deviation of an angle of the beam synthesizing prism after synthesizing the beams via an adjustment. This eliminates any requirement of precision of parts or an adjustment precision required when fixing the collimating lenses. Therefore, it is possible to provide a multi-beam light source unit having a superior productivity.

In the multi-beam light source unit according to still another aspect of preferred embodiments of the present invention, the first and second light source sections and the beam synthesizing device are assembled into an integral module so as to be attachable or detachable to or from an optical housing or mounting member. Further, the module is rotatably supported relative to an optical axis of a main scanning optical device as a rotational axis with the light emitting axis of one of the light source sections matched to the optical axis. With this configuration, it is possible to correct changes of a pitch with the passage of time in the sub-scanning direction or to switch recording densities by merely providing a simple drive unit for rotating an optical axis of an optical scanner with the mounting member having an axis that is coincident with the optical axis.

The multi-beam light source unit according to another aspect of preferred embodiments of the present invention further includes a mounting member for holding the first and second light source sections and the beam synthesizer which are assembled into an integral module. The mounting member is rotatably supported relative to an optical scanning device for scanning a surface to be scanned in the main scanning direction with beam spots formed by converging a plurality of light beams from the multi-beam light source unit and around an optical axis of the scanning apparatus functioning as a rotational center. Further, the first and second light source sections are arranged so that the light emitting axis of the first light source section and the light emitting axis of the second light source section are symmetrical relative to the optical axis in the main scanning direction. With this configuration, a beam pitch can be corrected to a desired beam pitch even after the light source unit which has been assembled is mounted onto the optical scanning apparatus. Thus, this configuration improves an assembling efficiency and allows only the light source unit to be replaced, thereby reducing a repair cost.

In the multi-beam light source unit according to another aspect of preferred embodiments of the present invention, a mounting reference surface of the mounting member is preferably substantially perpendicular to each light emitting axis of the first and second light source sections. Therefore, a beam pitch can be set in the sub-scanning direction by only making the rotational adjustments of three axes as mentioned above, which simplifies and improves an assembling efficiency.

In the multi-beam light source unit according to another aspect of preferred embodiments of the present invention, the semiconductor lasers and the collimating lenses symmetrically disposed relative to the light emitting axes of the first and second light source sections are arranged such that the lasers have equal shift amounts from the collimating lens optical axis. Therefore, it is possible to obtain scanning lines in which asymmetry of the sub-scanning beam pitches is reduced and consequently, equal scanning line intervals in the sub-scanning are maintained on the scanned surface. Thus, it is possible to provide a multi-beam light source unit which is capable of recording high-quality images with a stable image formation despite the passage of time.

In the multi-beam light source unit according to still another aspect of preferred embodiments of the present invention, the shifts of the semiconductor lasers from the collimating lens optical axes are set so that the main light beams emitted from the plurality of semiconductor lasers supported by the first light source section intersect each other in the main scanning direction near a rotary polygon mirror of an optical scanning apparatus and so that the main light beams emitted from the plurality of semiconductor lasers supported by the second light source section intersect each other in the main scanning direction near the rotary polygon mirror of the optical scanning apparatus. Therefore, it is possible to eliminate a problem of asymmetric sub-scanning beam pitches while minimizing unevenness in the positions of light beams incident on a reflective surface of the rotary polygon mirror in the main scanning direction, and consequently, it becomes possible to reduce a size of an inner diameter of the rotary polygon mirror.

In the multi-beam light source unit according to another aspect of preferred embodiments of the present invention, the light emitting axis of the first light source section and the light emitting axis of the second light source section are spaced at a given angle or at a given interval in the main scanning direction so that the light emitting axes intersect each other in the main scanning direction near the rotary polygon mirror of the scanning optical apparatus, by which it is also possible to minimize unevenness in the positions of light beams incident on a reflective surface of the rotary polygon mirror in the main scanning direction, so as to minimize an inner diameter of the rotary polygon mirror.

While the invention has been particularly shown and described with reference to preferred embodiments thereof, it will be understood by those skilled in the art that the foregoing and other changes in forms and details may be made therein without departing from the spirit and scope of the invention.

What is claimed is:

1. A multi-beam light source, comprising:
   a plurality of semiconductor lasers located adjacent to each other and emitting light beams;
   a plurality of collimating lenses for collimating light beams received from the respective semiconductor lasers; and
   a supporting member supporting the plurality of semiconductor lasers and the plurality of collimating lenses, the semiconductor lasers and the collimating lenses being arranged such that a distance between adjacent ones of the semiconductor lasers is not equal to a distance between adjacent ones of the collimating lenses; wherein
   the supporting member is mounted so as to be capable of being rotatably adjusted so as to change a rotational orientation of the supporting member.

2. The light source according to claim 1, wherein the semiconductor lasers are mounted on the supporting member so as to be capable of being rotatably adjusted independently of rotational adjustment of the supporting member so as to change a rotational orientation of the semiconductor lasers relative to the supporting member and the collimating lenses are mounted on the supporting member so as to be capable of being rotatably adjusted independently of rotational adjustment of the semiconductor lasers and the supporting member so as to change a rotational orientation of the collimating lenses relative to the supporting member.

3. The light source according to claim 1, wherein the semiconductor lasers and the collimating lenses are rotatably mounted on the supporting member such that an angular position of the semiconductor lasers and the collimating lenses can be changed relative to the supporting member.

4. The light source according to claim 1, further comprising an adjusting device which is removably connected to the supporting member for adjusting the angular position of the supporting member, the semiconductor lasers and the collimating lenses.

5. The light source according to claim 1, wherein the supporting member, the semiconductor lasers and the collimating lenses comprise a light source unit, further comprising a light source unit adjusting device for adjusting the angular position of the light source unit in a rotational direction relative to a central axis of the supporting member.

6. The light source according to claim 1, further comprising a mounting member arranged to have the supporting member disposed thereon such that the supporting member is rotatable relative to the mounting member.

7. The light source according to claim 6, wherein the supporting member, the semiconductor lasers and the collimating lenses comprise a light source unit, and a mounting reference surface of said mounting member is substantially perpendicular to the light emitting axis of the light source unit.

8. The light source according to claim 1, wherein the supporting member, the semiconductor lasers and the collimating lenses comprise a light source unit, and each of the semiconductor lasers is arranged relative to a light emitting axis of the first light source to have equal shift amounts from axes of the collimating lenses.

9. The light source according to claim 8, wherein the shifts of the semiconductor lasers from the collimating lens optical axes are set so that main light beams emitted from the plurality of semiconductor lasers intersect each other in the main scanning direction near a rotary polygon mirror of an optical scanning apparatus.

10. The light source according to claim 1, wherein the distance between adjacent ones of the semiconductor lasers is represented by D and the distance between adjacent ones of the collimating lenses is represented by d, the semiconductor lasers and the collimating lenses being arranged such that a relationship D/d>1 is satisfied.

11. The light source according to claim 1, wherein the distance between adjacent ones of the semiconductor lasers is represented by D and the distance between adjacent ones of the collimating lenses is represented by d, the semiconductor lasers and the collimating lenses being arranged such that a relationship D/d<1 is satisfied.

12. A multi-beam light source, comprising:
   a first light source section including:
      a plurality of first semiconductor lasers;
      a plurality of first collimating lenses for collimating light beams received from the first semiconductor lasers; and
      a first supporting member for supporting said first semiconductor lasers and said first collimating lenses arranged along a first light emitting axis;

a second light source section including:
   a plurality of second semiconductor lasers,
   a plurality of second collimating lenses for collimating light beams received from the second semiconductor lasers; and
   a second supporting member for supporting said plurality of second semiconductor lasers and said plurality of second collimating lenses arranged along a second light emitting axis; wherein
      the first semiconductor lasers and the first collimating lenses are arranged such that a distance between adjacent ones of the first semiconductor lasers is not equal to a distance between adjacent ones of the first collimating lenses, the second semiconductor lasers and the second collimating lenses are arranged such that a distance between adjacent ones of the second semiconductor lasers is not equal to a distance between adjacent ones of the second collimating lenses; and
      at least one of the first and second supporting members is mounted so as to be capable of being rotatably adjusted so as to change a rotational orientation of the at least one of the first and second supporting members.

13. The light source according to claim 12, wherein each of the first and second supporting members is mounted so as to be capable of being rotatably adjusted so as to change a rotational orientation of the each of the first and second supporting members, the first and second semiconductor lasers and the first and second collimating lenses.

14. The light source according to claim 13, wherein the first and second supporting members are rotatable independent of each other.

15. The light source according to claim 12, wherein the first semiconductor lasers and the first collimating lenses are adjustably mounted on the first supporting member such that a position of the first semiconductor lasers and the first collimating lenses can be changed relative to the first supporting member.

16. The light source according to claim 12, wherein the second semiconductor lasers and the second collimating lenses are adjustably mounted on the second supporting member such that a position of the second semiconductor lasers and the second collimating lenses can be changed relative to the second supporting member.

17. The light source according to claim 12, wherein the first semiconductor lasers and the first collimating lenses are adjustably mounted on the first supporting member such that a position of the first semiconductor lasers and the first collimating lenses can be changed relative to the first supporting member, and the second semiconductor lasers and the second collimating lenses are rotatably mounted on the second supporting member such that an angular position of the second semiconductor lasers and the second collimating lenses can be changed relative to the second supporting member.

18. The light source according to claim 12, further comprising an adjusting device which is removably connected to the at least one of the first and second supporting members for adjusting the angular position of the at least one of the first and second supporting members.

19. The light source according to claim 12, further comprising a first mounting member arranged to have the first supporting member disposed thereon such that the first supporting member is rotatable relative to the first mounting member.

20. The light source according to claim 19, further comprising a second mounting member arranged to have the second supporting member disposed thereon such that the second supporting member is rotatable relative to the second mounting member.

21. The light source according to claim 12, wherein the distance between adjacent ones of the first semiconductor lasers is represented by D and the distance between adjacent ones of the first collimating lenses is represented by d, the first semiconductor lasers and the first collimating lenses being arranged such that a relationship $D/d>1$ is satisfied.

22. The light source according to claim 12, wherein the distance between adjacent ones of the second semiconductor lasers is represented by D and the distance between adjacent ones of the second collimating lenses is represented by d, the second semiconductor lasers and the second collimating lenses being arranged such that a relationship $D/d>1$ is satisfied.

23. The light source according to claim 12, wherein the distance between adjacent ones of the first semiconductor lasers is represented by D and the distance between adjacent ones of the first collimating lenses is represented by d, the first semiconductor lasers and the first collimating lenses being arranged such that a relationship $D/d<1$ is satisfied.

24. The light source according to claim 12, wherein the distance between adjacent ones of the second semiconductor lasers is represented by D and the distance between adjacent ones of the second collimating lenses is represented by d, the second semiconductor lasers and the second collimating lenses being arranged such that a relationship $D/d<1$ is satisfied.

25. The light source according to claim 12, wherein the first light source section includes an odd number of the first semiconductor lasers and an odd number of the first collimating lenses, and the second light source section has an even number of the second semiconductor lasers and an even number of the second collimating lenses, and a light emitting axis of said first light source section and a light emitting axis of said second light source section are spaced from each other at a distance in the main scanning direction.

26. The light source according to claim 12, further comprising a beam synthesizer for emitting light beams received from said first and second light source sections so as to bring the light beams closer to each other, wherein said first and second light source sections and the beam synthesizer are assembled into an integral module so as to be attachable or detachable to or from an optical housing and wherein the integral module is rotatably supported relative to an optical axis of a main scanning optical apparatus in which the light source is provided such that the light emitting axis of one of the first and second light source sections is coincident with the optical axis of the main scanning optical apparatus.

27. The light source according to claim 26, further comprising a mounting member for mounting the integral module including said first and second light source sections and said beam synthesizer, wherein said mounting member is supported rotatably relative to the scanning optical apparatus for scanning a surface to be scanned in the main scanning direction with beam spots formed by converging a plurality of light beams from the first and second light source sections, and wherein the first and second light source sections are arranged so that the light emitting axis of the first light source section and the light emitting axis of the second light source section are symmetrical relative to the optical axis in the main scanning direction.

28. The light source according to claim 27, wherein a mounting reference surface of said mounting member is substantially perpendicular to each light emitting axis of the first and second light source sections.

29. The light source according to claim 12, wherein the first and second semiconductor lasers are symmetrically arranged relative to a respective one of the light emitting axes of the first and second light source sections and are shifted by an equal distance relative to an optical axis of the respective collimating lens.

30. The light source according to claim 29, wherein the shifts of the first and second semiconductor lasers from the collimating lens optical axes are set so that the main light beams emitted from the plurality of first semiconductor lasers supported by the first light source section intersect each other in the main scanning direction near a rotary polygon mirror of an optical scanning apparatus, and so that the main light beams emitted from the plurality of second semiconductor lasers supported by the second light source section intersect each other in the main scanning direction near the rotary polygon mirror of the optical scanning apparatus.

31. A multi-beam light source, comprising:
   a plurality of light beam emitting means located adjacent to each other for emitting light beams;
   a plurality of collimating means for collimating light beams received from the respective light beam emitting means; and
   a supporting means supporting the plurality of light beam emitting means and the plurality of collimating means, the light beam emitting means and collimating means being arranged such that a distance between adjacent ones of the light beam emitting means is not equal to a distance between adjacent ones of the collimating means; wherein
      the supporting means is mounted so as to be capable of being rotatably adjusted so as to change a rotational orientation of the supporting means.

32. A multi-beam light source, comprising:
   a first light source means including:
      a plurality of first light emitting means;
      a plurality of first collimating means for collimating light beams received from the first light emitting means; and
      a first supporting means for supporting said first light emitting means and said first collimating means arranged along a first light emitting axis;
   a second light source means including:
      a plurality of second light emitting means,
      a plurality of second collimating means for collimating light beams received from the second light emitting means; and
      a second supporting means for supporting said plurality of second light emitting means and said plurality of second collimating means arranged along a second light emitting axis; wherein
         the first light emitting means and the first collimating means are arranged such that a distance between adjacent ones of the first light emitting means is not equal to a distance between adjacent ones of the first collimating means, the second light emitting means and the second collimating means are arranged such that a distance between adjacent ones of the second light emitting means is not equal to a distance between adjacent ones of the second collimating means; and
         at least one of the first and second supporting means is mounted so as to be capable of being rotatably adjusted so as to change a rotational orientation of the at least one of the first and second supporting means.

33. An image forming apparatus comprising:
   a multi-beam light source including:
      a plurality of semiconductor lasers located adjacent to each other and emitting light beams;
      a plurality of collimating lenses for collimating light beams received from the respective semiconductor lasers; and
      a supporting member supporting the plurality of semiconductor lasers and the plurality of collimating lenses, the semiconductor lasers and the collimating lenses being arranged such that a distance between adjacent ones of the semiconductor lasers is not equal to a distance between adjacent ones of the collimating lenses; wherein
         the supporting member is mounted so as to be capable of being rotatably adjusted so as to change a rotational orientation of the supporting member.

34. An image forming apparatus, comprising:
   a multi-beam light source including:
      a first light source section including:
         a plurality of first semiconductor lasers;
         a plurality of first collimating lenses for collimating light beams received from the first semiconductor lasers; and
         a first supporting member for supporting said first semiconductor lasers and said first collimating lenses arranged along a first light emitting axis;
      a second light source section including:
         a plurality of second semiconductor lasers,
         a plurality of second collimating lenses for collimating light beams received from the second semiconductor lasers; and
         a second supporting member for supporting said plurality of second semiconductor lasers and said plurality of second collimating lenses arranged along a second light emitting axis; wherein
            the first semiconductor lasers and the first collimating lenses are arranged such that a distance between adjacent ones of the first semiconductor lasers is not equal to a distance between adjacent ones of the first collimating lenses, the second semiconductor lasers and the second collimating lenses are arranged such that a distance between adjacent ones of the second semiconductor lasers is not equal to a distance between adjacent ones of the second collimating lenses; and
            at least one of the first and second supporting members is mounted so as to be capable of being rotatably adjusted so as to change a rotational orientation of the at least one of the first and second supporting members.

35. An optical scanning apparatus comprising:
   a multi-beam light source including:
      a plurality of semiconductor lasers located adjacent to each other and emitting light beams;
      a plurality of collimating lenses for collimating light beams received from the respective semiconductor lasers; and
      a supporting member supporting the plurality of semiconductor lasers and the plurality of collimating lenses, the semiconductor lasers and the collimating lenses being arranged such that a distance between adjacent ones of the semiconductor lasers is not equal to a distance between adjacent ones of the collimating lenses; wherein
      the supporting member is mounted so as to be capable of being rotatably adjusted so as to change a rotational orientation of the supporting member;

a first optical system for forming a linear image;
an optical deflector arranged to deflect the linear image received from the first optical system; and
a second optical system arranged to receive a deflected linear image from the optical deflector and to form a beam spot on a surface to be scanned.

36. An optical scanning apparatus, comprising:
a first optical system for forming a linear image, the first optical system having a multi-beam light source including:
   a first light source section including:
      a plurality of first semiconductor lasers;
      a plurality of first collimating lenses for collimating light beams received from the first semiconductor lasers; and
      a first supporting member for supporting said first semiconductor lasers and said first collimating lenses arranged along a first light emitting axis;
   a second light source section including:
      a plurality of second semiconductor lasers,
      a plurality of second collimating lenses for collimating light beams received from the second semiconductor lasers; and
      a second supporting member for supporting said plurality of second semiconductor lasers and said plurality of second collimating lenses arranged along a second light emitting axis; wherein
      the first semiconductor lasers and the first collimating lenses are arranged such that a distance between adjacent ones of the first semiconductor lasers is not equal to a distance between adjacent ones of the first collimating lenses, the second semiconductor lasers and the second collimating lenses are arranged such that a distance between adjacent ones of the second semiconductor lasers is not equal to a distance between adjacent ones of the second collimating lenses; and
      at least one of the first and second supporting members is mounted so as to be capable of being rotatably adjusted so as to change a rotational orientation of the at least one of the first and second supporting members;
an optical deflector arranged to deflect the linear image received from the first optical system; and
a second optical system arranged to receive a deflected linear image from the optical deflector and to form a beam spot on a surface to be scanned.

37. A multi-beam light source, comprising:
a first light source section including:
   a plurality of first semiconductor lasers;
   a plurality of first collimating lenses for collimating light beams received from the first semiconductor lasers; and
   a first supporting member for supporting said first semiconductor lasers and said first collimating lenses arranged along a first light emitting axis;
a second light source section including:
   a plurality of second semiconductor lasers,
   a plurality of second collimating lenses for collimating light beams received from the second semiconductor lasers;
   a second supporting member for supporting said plurality of second semiconductor lasers and said plurality of second collimating lenses arranged along a second light emitting axis;
a beam synthesizer for emitting light beams received from said first and second light source sections so as to bring the light beams closer to each other, wherein the first and second light source sections and the beam synthesizer are assembled into an integral module so as to be attachable or detachable to or from an optical housing and wherein the integral module is rotatably supported relative to an optical axis of a main scanning optical apparatus in which the light source is provided such that the light emitting axis of one of the first and second light source sections is coincident with the optical axis of the main scanning optical apparatus; and
a mounting member for mounting the integral module including said first and second light source sections and said beam synthesizer; wherein
   the first semiconductor lasers and the first collimating lenses are arranged such that a distance between adjacent ones of the first semiconductor lasers is not equal to a distance between adjacent ones of the first collimating lenses, the second semiconductor lasers and the second collimating lenses are arranged such that a distance between adjacent ones of the second semiconductor lasers is not equal to a distance between adjacent ones of the second collimating lenses, and a distance between adjacent ones of the first semiconductor lasers is equal to a distance between adjacent ones of the second semiconductor lasers; and
at least one of the first and second supporting members is mounted so as to be capable of being rotatably adjusted so as to change a rotational orientation of the at least one of the first and second supporting members such that a first sub-scanning distance between a first set of adjacent beam spots produced by adjacent ones of the first and second semiconductor lasers is equal to a second sub-scanning distance between a second set of adjacent beam spots produced by adjacent ones of the first and second semiconductor lasers and a third sub-scanning distance between a third set of beam spots produced either by the first semiconductor lasers or the second semiconductor lasers;
said mounting member is supported so as to be rotatably adjusted such that fourth sub-scanning distances between each of a fourth set of at least four adjacent beam spots produced by adjacent ones of the first and second semiconductor lasers are equal.

38. A multi-beam light source, comprising:
a first light source means including:
   a plurality of first light emitting means;
   a plurality of first collimating means for collimating light beams received from the first light emitting means; and
   a first supporting means for supporting said first light emitting means and said first collimating means arranged along a first light emitting axis;
a second light source means including:
   a plurality of second light emitting means, a plurality of second collimating means for collimating light beams received from the second light emitting means;
   a second supporting means for supporting said plurality of second light emitting means and said plurality of second collimating means arranged along a second light emitting axis;
   a beam synthesizing means for emitting light beams received from said first and second light source means so as to bring the light beams closer to each other; and a mounting means for mounting an integral module means including said first and second light source means and said beam synthesizing means; wherein the first light emitting means and the first collimating means are arranged such that a distance between adjacent ones of the first light emitting means is not equal to a distance between adjacent ones of the first collimating means, the second light emitting means and the second collimating means are arranged such that a distance between adjacent ones of the second light emitting means is not equal to a distance between adjacent ones of the second collimating means, and a distance between adjacent ones of the first light emitting means is equal to a distance between adjacent ones of the second light emitting means; and at least one of the first and second supporting means is mounted so as to be capable of being rotatably adjusted so as to change a rotational orientation of the at least one of the first and second supporting means such that a distance between a first set of adjacent beam spots produced by adjacent ones of the first and second light emitting means is equal to a distance between a second set of adjacent beam spots produced by adjacent ones of the first and second light emitting means;

said mounting means is supported so as to be rotatably adjusted such that distances between each of a third set of at least four adjacent beam spots produced by adjacent ones of the first and second light emitting means are equal.

39. An image forming apparatus comprising:

a multi-beam light source including:
a first light source section including:
a plurality of first semiconductor lasers;
a plurality of first collimating lenses for collimating light beams received from the first semiconductor lasers; and
a first supporting member for supporting said first semiconductor lasers and said first collimating lenses arranged along a first light emitting axis;
a second light source section including:
a plurality of second semiconductor lasers,
a plurality of second collimating lenses for collimating light beams received from the second semiconductor lasers;
a second supporting member for supporting said plurality of second semiconductor lasers and said plurality of second collimating lenses arranged along a second light emitting axis;
a beam synthesizer for emitting light beams received from said first and second light source sections so as to bring the light beams closer to each other; and
a mounting member for mounting the integral module including said first and second light source sections and said beam synthesizer; wherein
the first semiconductor lasers and the first collimating lenses are arranged such that a distance between adjacent ones of the first semiconductor lasers is not equal to a distance between adjacent ones of the first collimating lenses, the second semiconductor lasers and the second collimating lenses are arranged such that a distance between adjacent ones of the second semiconductor lasers is not equal to a distance between adjacent ones of the second collimating lenses, and a distance between adjacent ones of the first semiconductor lasers is equal to a distance between adjacent ones of the second semiconductor lasers; and at least one of the first and second supporting members is mounted so as to be capable of being rotatably adjusted so as to change a rotational orientation of the at least one of the first and second supporting members such that a distance between a first set of adjacent beam spots produced by adjacent ones of the first and second semiconductor lasers is equal to a distance between a second set of adjacent beam spots produced by adjacent ones of the first and second semiconductor lasers;

said mounting member is supported so as to be rotatably adjusted such that distances between each of a third set of at least four adjacent beam spots produced by adjacent ones of the first and second semiconductor lasers are equal.

40. An optical scanning apparatus, comprising:

a first optical system for forming a linear image, the first optical system having a multi-beam light source including:
a first light source section including:
a plurality of first semiconductor lasers;
a plurality of first collimating lenses for collimating light beams received from the first semiconductor lasers; and
a first supporting member for supporting said first semiconductor lasers and said first collimating lenses arranged along a first light emitting axis;
a second light source section including:
a plurality of second semiconductor lasers,
a plurality of second collimating lenses for collimating light beams received from the second semiconductor lasers;
a second supporting member for supporting said plurality of second semiconductor lasers and said plurality of second collimating lenses arranged along a second light emitting axis;
a beam synthesizer for emitting light beams received from said first and second light source sections so as to bring the light beams closer to each other, wherein the first and second light source sections and the beam synthesizer are assembled into an integral module so as to be attachable or detachable to or from an optical housing and wherein the integral module is rotatably supported relative to an optical axis of a main scanning optical apparatus in which the light source is provided such that the light emitting axis of one of the first and second light source sections is coincident with the optical axis of the main scanning optical apparatus; and
a mounting member for mounting the integral module including said first and second light source sections and said beam synthesizer; wherein
the first semiconductor lasers and the first collimating lenses are arranged such that a distance between adjacent ones of the first semiconductor lasers is not equal to a distance between adjacent ones of the first collimating lenses, the second semiconductor lasers and the second collimating lenses are arranged such that a distance between adjacent ones of the second semiconductor lasers is not equal to a distance between adjacent ones of the second collimating lenses, and a distance between adjacent ones of the first semiconductor lasers is equal to a distance between adjacent ones of the second semiconductor lasers; and at least one of the first and second supporting members is mounted so as to be capable of being rotatably adjusted so as to change a rotational orientation of the at least one of the first and second supporting members such that a distance between a first set of adjacent beam spots produced by adjacent ones of the first and second semiconductor lasers is equal to a distance between a second set of adjacent beam spots produced by adjacent ones of the first and second semiconductor lasers;

said mounting member is supported so as to be rotatably adjusted such that distances between each of a third set of at least four adjacent beam spots produced by adjacent ones of the first and second semiconductor lasers are equal;

an optical deflector arranged to deflect the linear image received from the first optical system; and a second optical system arranged to receive a deflected linear image from the optical deflector and to form a beam spot on a surface to be scanned.

* * * * *